(12) United States Patent
We et al.

(10) Patent No.: US 12,733,095 B2
(45) Date of Patent: Sep. 8, 2026

(54) PACKAGE COMPRISING A SUBSTRATE WITH AN INTERCONNECT BLOCK

(71) Applicant: QUALCOMM Incorporated, San Diego, CA (US)

(72) Inventors: Hong Bok We, San Diego, CA (US); Joan Rey Villarba Buot, Escondido, CA (US); Sang-Jae Lee, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 381 days.

(21) Appl. No.: 18/470,148

(22) Filed: Sep. 19, 2023

(65) Prior Publication Data

US 2025/0098066 A1 Mar. 20, 2025

(51) Int. Cl.

| | |
|---|---|
| ***H05K 1/11*** | (2006.01) |
| ***H10W 70/60*** | (2026.01) |
| ***H10W 70/685*** | (2026.01) |
| ***H10W 72/00*** | (2026.01) |
| ***H10W 72/20*** | (2026.01) |
| ***H10W 90/00*** | (2026.01) |

(52) U.S. Cl.

CPC ........... *H05K 1/115* (2013.01); *H10W 70/611* (2026.01); *H10W 70/685* (2026.01); *H10W 90/00* (2026.01); *H05K 2201/096* (2013.01); *H10W 72/07252* (2026.01); *H10W 72/227* (2026.01); *H10W 90/724* (2026.01)

(58) Field of Classification Search

None

See application file for complete search history.

(56) References Cited

U.S. PATENT DOCUMENTS

2015/0116965 A1* 4/2015 Kim ......................... H05K 1/18 361/767
2020/0083179 A1* 3/2020 Lee ..................... H10W 42/121
2020/0111734 A1 4/2020 Lin et al.
2021/0225780 A1 7/2021 Wu et al.
2023/0164921 A1* 5/2023 Yoo ........................ H05K 1/183 361/761
2023/0298987 A1* 9/2023 Leitgeb ................ H05K 3/4694 257/668

FOREIGN PATENT DOCUMENTS

KR 101966328 B1 4/2019

OTHER PUBLICATIONS

International Search Report and Written Opinion—PCT/US2024/045133—ISA/EPO—Oct. 25, 2024.

* cited by examiner

*Primary Examiner* — Nduka E Ojeh
(74) *Attorney, Agent, or Firm* — Loza & Loza, LLP

(57) ABSTRACT

A substrate comprising a core layer, at least one first dielectric layer coupled to a first surface of the core layer, at least one second dielectric layer coupled to a second surface of the core layer, a plurality of interconnects located at least partially in the at least one first dielectric layer; a region comprising a plurality of block interconnects of an interconnect block; and a solder resist layer coupled to the at least one first dielectric layer.

18 Claims, 17 Drawing Sheets

PROFILE CROSS SECTIONAL VIEW

PROFILE CROSS SECTIONAL VIEW

PROFILE CROSS SECTIONAL VIEW

DIELECTRIC LAYER FORMATION

CAVITY FORMATION

INTERCONNECT FORMATION

DIELECTRIC LAYER FORMATION

4 CAVITY FORMATION 711 710 701 720 721

5 INTERCONNECT FORMATION 712 710 701 720 724

FIG. 7B

PACKAGE COMPRISING A SUBSTRATE WITH AN INTERCONNECT BLOCK

FIELD

Various features relate to packages and substrates.

BACKGROUND

Packages can include a substrate and integrated devices. The substrate may include a plurality of interconnects. Integrated devices may be coupled to the interconnects of the substrate. There is an ongoing need to improve the electrical connectivity of integrated devices through the substrate while also providing smaller packages with improved performances.

SUMMARY

Various features relate to packages and substrates.

One example provides a substrate comprising a core layer; at least one first dielectric layer coupled to a first surface of the core layer; at least one second dielectric layer coupled to a second surface of the core layer; a plurality of interconnects located at least partially in the at least one first dielectric layer; a region comprising a plurality of block interconnects of an interconnect block; and a solder resist layer coupled to the at least one first dielectric layer.

Another example provides a package comprising a substrate, a first integrated device coupled to the substrate through a first plurality of bump interconnects, and a second integrated device coupled to the substrate through a second plurality of bump interconnects. The substrate comprises a core layer; at least one first dielectric layer coupled to a first surface of the core layer; at least one second dielectric layer coupled to a second surface of the core layer; a plurality of interconnects located at least partially in the at least one first dielectric layer; a region comprising a plurality of block interconnects of an interconnect block; and a solder resist layer coupled to the at least one first dielectric layer.

Another example provides a method for fabricating a substrate. The method provides a core layer. The method forms at least one first dielectric layer that is coupled to a first surface of the core layer. The method forms at least one second dielectric layer that is coupled to a second surface of the core layer. The method forms a plurality of interconnects located at least partially in the at least one first dielectric layer. The method couples an interconnect block comprising a plurality of block interconnects, to the at least one first dielectric layer. The method forms an additional first dielectric layer around and over the interconnect block. The method forms a solder resist layer that is coupled to the at least one first dielectric layer.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 7A-7C illustrate an exemplary sequence for fabricating an interconnect block.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate, a first integrated device coupled to the substrate through a first plurality of bump interconnects, and a second integrated device coupled to the substrate through a second plurality of bump interconnects. The substrate comprises a core layer; at least one first dielectric layer coupled to a first surface of the core layer; at least one second dielectric layer coupled to a second surface of the core layer; a plurality of interconnects located at least partially in the at least one first dielectric layer; a region comprising a plurality of block interconnects of an interconnect block; and a solder resist layer coupled to the at least one first dielectric layer.

Exemplary Package with a Substrate Comprising an Interconnect Block

Figure 1:
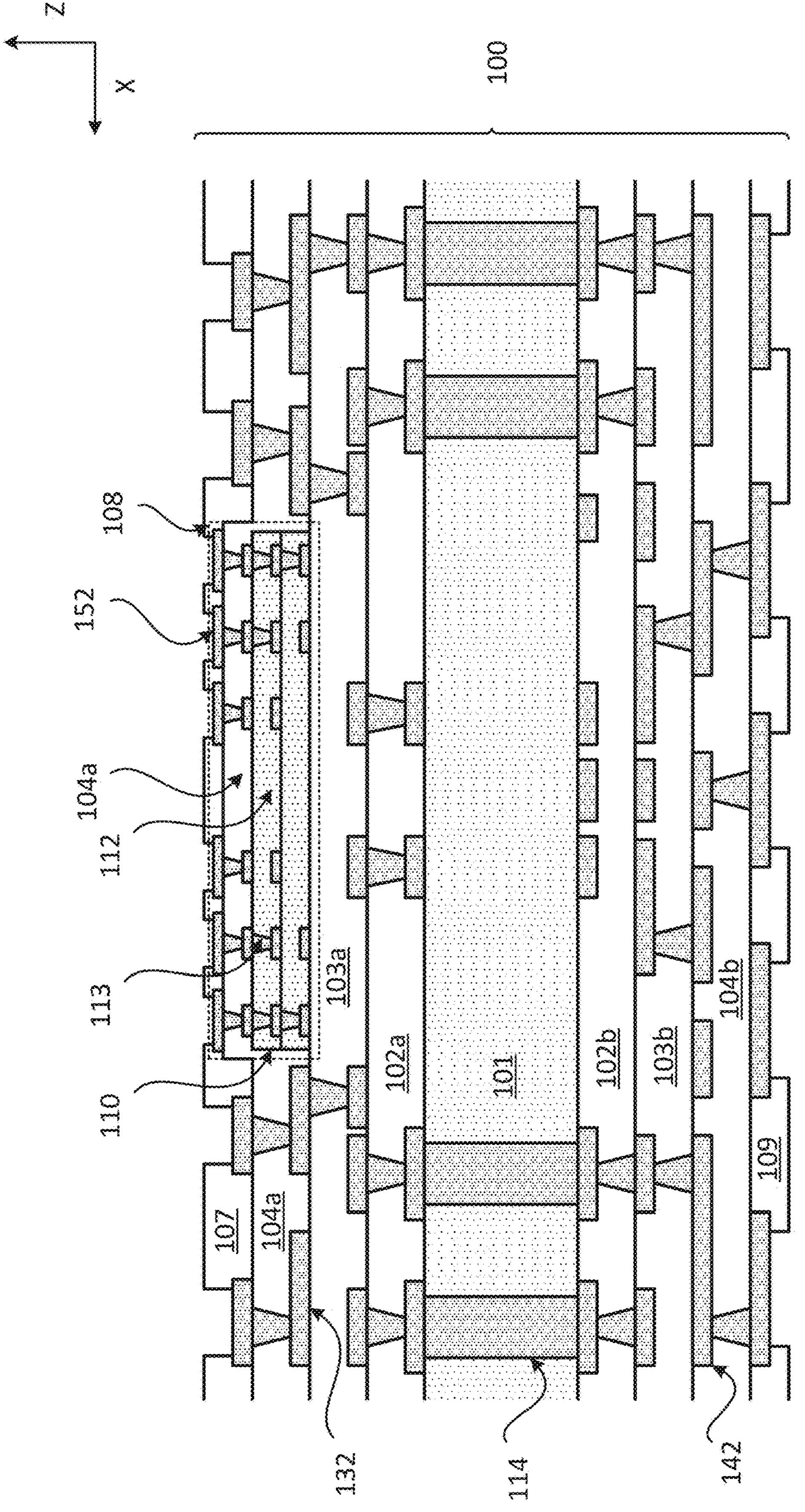
FIG. 1 illustrates an exemplary profile view of a substrate with an interconnect block.

FIG. 1 illustrates a profile view of a substrate 100 that includes an interconnect block. The substrate 100 may be part of a package that includes an integrated device. The substrate 100 includes a core layer 101, a dielectric layer 102*a*, a dielectric layer 102*b*, a dielectric layer 103*a*, a dielectric layer 103*b*, a dielectric layer 104*a*, a dielectric layer 104*b*, a solder resist layer 107, a solder resist layer 109, an interconnect block 110, a plurality of via interconnects 114, a plurality of interconnects 132, a plurality of interconnects 142 and a plurality of interconnects 152. The interconnect block 110 may include at least one block dielectric layer 112 and a plurality of block interconnects 113. The interconnect block 110 may be at least partially embedded in the substrate 100. The interconnect block 110 may be at least partially located in the dielectric layer 102*a*, the dielectric layer 103*a* and/or the dielectric layer 104*a*. The substrate 100 includes a region 108 (e.g., interconnect block region, bridge region) that includes the interconnect block 110 or components of the interconnect block 110. The region 108 may include the interconnect block 110 and the plurality of interconnects 152. The region 108 may include portions of the dielectric layer 104*a* (e.g., portions of the dielectric layer 104*a* located over the interconnect block 110). As will be further described below, in some implementations, the dielectric layers of the interconnect block 110 may be indistinguishable from the dielectric layer 104*a*, the dielectric layer 103*a*, and/or the dielectric layer 102*a*.

The plurality of via interconnects 114 may be located in the core layer 101. The plurality of via interconnects 114 may extend through the core layer 101. Different implementations may use different types of via interconnects. In some implementations, a plurality of via interconnects that extend through the core layer 101 may have via walls and a plurality of fills located within the via walls. In some implementations, part of the walls of via interconnects may be tapered (e.g., may have diagonal walls).

The dielectric layer 102*a* is coupled to a first surface (e.g., top surface) of the core layer 101. The dielectric layer 103*a* is coupled to the dielectric layer 102*a*. The interconnect block 110 is coupled to the dielectric layer 103*a*. The dielectric layer 104*a* is coupled to the dielectric layer 103*a* and the interconnect block 110. The plurality of interconnects 132 are located at least in the dielectric layer 102*a*, the dielectric layer 103*a* and/or the dielectric layer 104*a*. The plurality of interconnects 132 are coupled to the plurality of via interconnects 114. The plurality of interconnects 152 are located at least partially in the dielectric layer 104*a*. The plurality of interconnects 152 are coupled to the plurality of block interconnects 113. The plurality of interconnects 152 may be coupled to the plurality of interconnects 132. In some implementations, the plurality of interconnects 152 may be considered part of the plurality of interconnects 132. The plurality of interconnects 152 are located over the interconnect block 110. The solder resist layer 107 is located over a surface of the dielectric layer 104*a*. The solder resist layer 107 may have different portions with different thicknesses. For example, for a first portion of the solder resist layer 107 that is not vertically overlapping with the interconnect block 110, the first portion may have a first thickness, and for a second portion of the solder resist layer 107 that is vertically overlapping with the interconnect block 110, the second portion may have a second thickness that is less than the first thickness. Thus, despite the presence of the interconnect block 110, which has increased the thickness of the dielectric layer(s) over the core layer 101, the overall thickness of the substrate 100 has remained relatively the same, through the use of variable thicknesses for the solder resist layer 107. Thus, for example despite a step up in the thickness of the dielectric layers and an increase in the number of metal layers, there is no step up in the thickness of the solder resist layer 107. As will be further described below, the interconnect block 110 may be configured as a bridge to provide electrical paths between two or more integrated devices.

The dielectric layer 102*b* is coupled to a second surface (e.g., bottom surface) of the core layer 101. The dielectric layer 103*b* is coupled to the dielectric layer 102*b*. The dielectric layer 104*b* is coupled to the dielectric layer 103*b*. The plurality of interconnects 142 are located at least in the dielectric layer 102*b*, the dielectric layer 103*b* and/or the dielectric layer 104*b*. The plurality of interconnects 142 are coupled to the plurality of via interconnects 114. The solder resist layer 109 is located over a surface of the (e.g., below surface) the dielectric layer 104*b*.

The plurality of via interconnects 114 extend through the core layer 101. The plurality of fills 116 may be located within the plurality of via interconnects 114. The dielectric layer 102 is coupled to a first surface (e.g., top surface) of the core layer 101 and a second surface (e.g., bottom surface) of the core layer 101. The dielectric layer 102 may include a different material from the core layer 101.

Different implementations may use different materials for the dielectric layer 102*a*, the dielectric layer 102*b*, the dielectric layer 103*a*, the dielectric layer 103*b*, the dielectric layer 104*a* and/or the dielectric layer 104*b*. In some implementations, the dielectric layer 102*a*, the dielectric layer 102*b*, the dielectric layer 103*a*, the dielectric layer 103*b*, the dielectric layer 104*a* and/or the dielectric layer 104*b* may include prepreg and/or Ajinomoto Build-up Film (ABF). In some implementations, the dielectric layer 102*a*, the dielectric layer 102*b*, the dielectric layer 103*a*, the dielectric layer 103*b*, the dielectric layer 104*a*, and/or the dielectric layer 104*b* may include a polymer. The dielectric layer 102*a*, the dielectric layer 102*b*, the dielectric layer 103*a*, the dielectric layer 103*b*, the dielectric layer 104*a*, and/or the dielectric layer 104*b* may include a different type of dielectric from the core layer 101.

The dielectric layer 104*a* may form a step shape over the interconnect block 110. For example, the dielectric layer 104*a* may have (i) a first horizontal surface that is approximately parallel to a surface of the core layer 101, and (ii) a second horizontal surface that is approximately parallel to the same surface of the core layer 101, where the distance between the second horizontal surface of the dielectric layer 104*a* and a first surface of the core layer 101 is greater than the distance between the first horizontal surface of the dielectric layer 104*a*. The first horizontal surface of the dielectric layer 104*a* may be a surface that does not vertically overlap with the interconnect block 110, and the second horizontal surface of the dielectric layer 104*a* may be a surface that vertically overlaps with the interconnect block 110.

The solder resist layer 107 may include a first horizontal surface that is approximately parallel to the surface of the core layer 101. Despite the step shape of the dielectric layer 104*a*, the solder resist layer 107 may have a first horizontal surface that is approximately parallel to the first surface of the core layer 101, where the distance between a portion of the first horizontal surface of the solder resist layer 107 (portion that does not vertically overlap with the interconnect block 110) and the first surface of the core layer 101 is about the same as the distance between another portion of the first horizontal surface of the solder resist layer 107 (portion that vertically overlaps with the interconnect block 110). This configuration and/or structure may provide an effective path for integrated device to integrated device connectivity, while still keeping the overall thickness of the package relatively thin.

Figure 2:
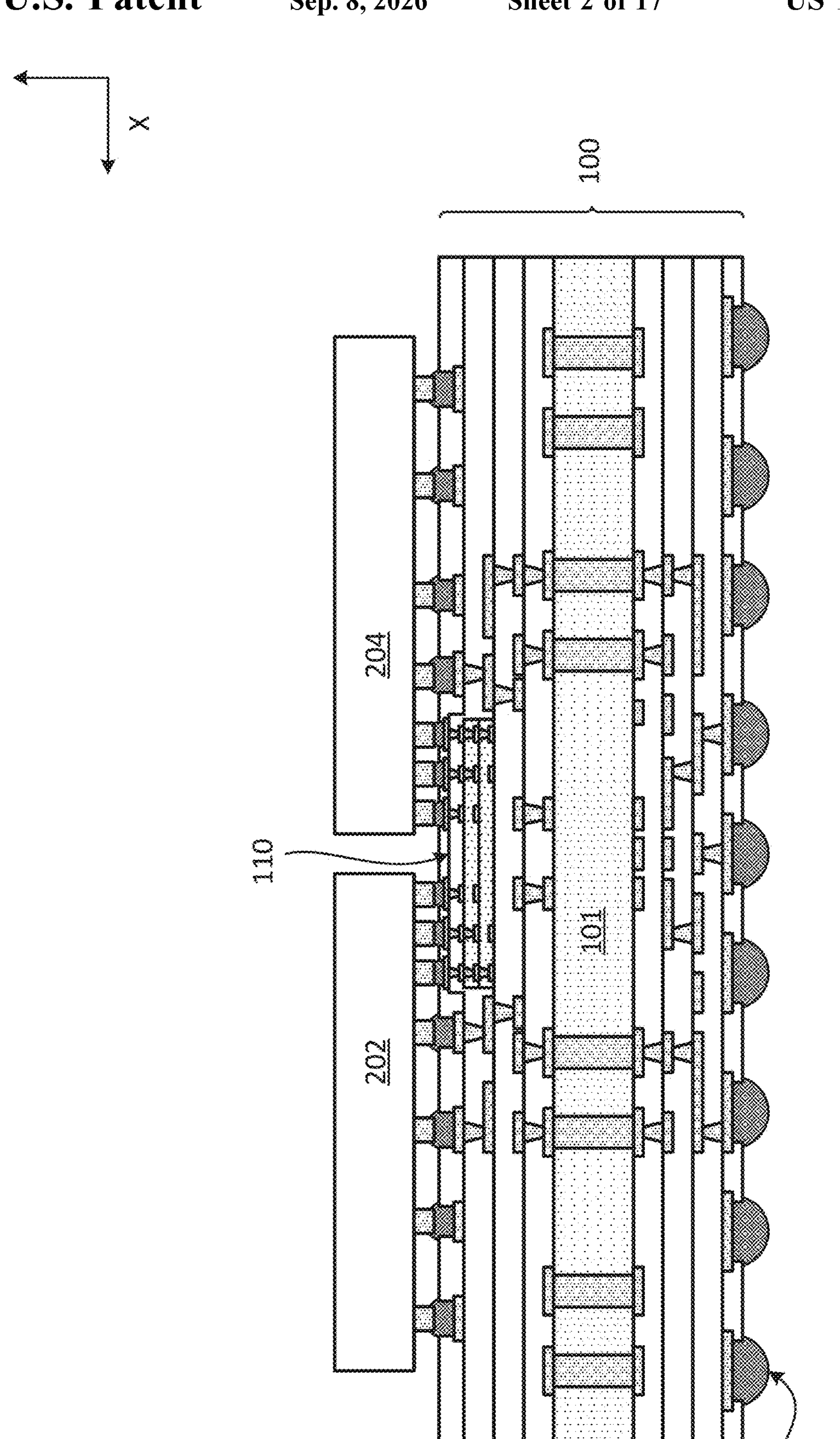
FIG. 2 illustrates an exemplary profile view of a package that includes an integrated device and a substrate with an interconnect block.

FIG. 2 illustrates a package 200 that includes a substrate comprising an interconnect block. The package 200 includes the substrate 100, an integrated device 202 and an integrated device 204. The substrate 100 may include an interconnect block 110, as described in FIG. 1. The integrated device 202 is coupled to the substrate 100 through a plurality of bump interconnects. The integrated device 204 is coupled to the substrate 100 through a plurality of bump interconnects.

Figure 3:
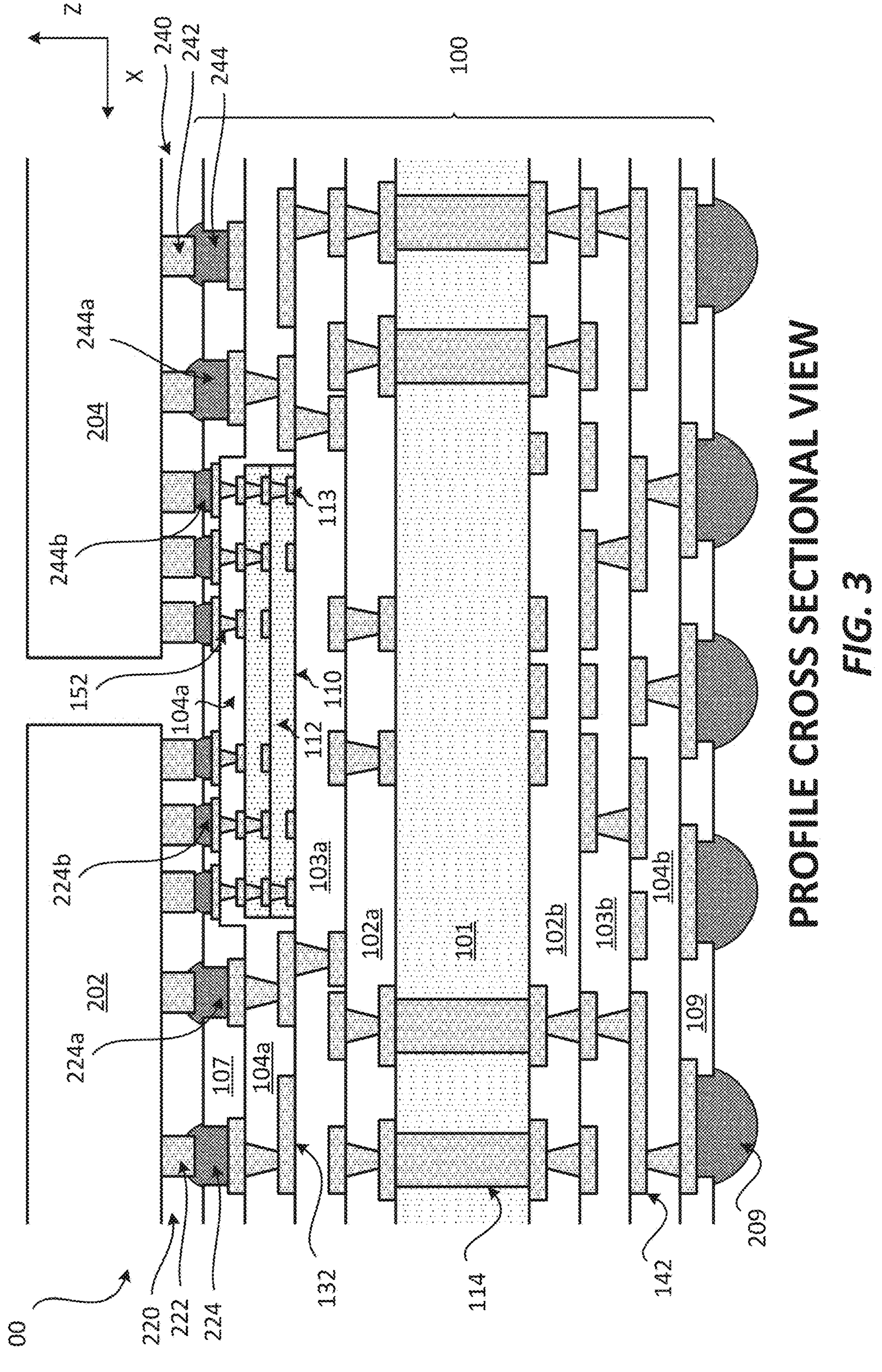
FIG. 3 illustrates a close up view of an example of a profile view of a package that includes an integrated device and a substrate with an interconnect block.

FIG. 3 illustrates a close up view of the package 200 that includes a substrate comprising an interconnect block. As mentioned above, the package 200 includes the substrate 100, the integrated device 202 and the integrated device 204. The substrate 100 includes the interconnect block 110.

The integrated device 202 is coupled to the substrate 100 through a plurality of bump interconnects 220. The plurality of bump interconnects 220 may include a plurality of pillar interconnects 222 and a plurality of solder interconnects 224. The integrated device 202 may be coupled to the plurality of interconnects 132 and/or the plurality of interconnects 152 through the plurality of bump interconnects 220. The plurality of pillar interconnects 222 may be coupled to the integrated device 202 (e.g., pad interconnects of the integrated device 204). The plurality of solder interconnects 224 may be coupled to the plurality of pillar interconnects 222. In some implementations, the plurality of pillar interconnects 222 and/or the plurality of solder interconnects 224 may be considered part of the integrated device 202. The plurality of solder interconnects 224 may be coupled to plurality of interconnects 132 and/or the plurality of interconnects 152. The plurality of solder interconnects 224 may include a plurality of solder interconnects 224*a* and a plurality of solder interconnects 224*b*. In some implementations, there may not be a plurality of pillar interconnects 222. Thus, the plurality of solder interconnects 224 may be coupled to pad interconnects of the integrated device 202.

The integrated device 204 is coupled to the substrate 100 through a plurality of bump interconnects 240. The plurality of bump interconnects 240 may include a plurality of pillar interconnects 242 and a plurality of solder interconnects 244. The integrated device 204 may be coupled to the plurality of interconnects 132 and/or the plurality of interconnects 152 through the plurality of bump interconnects 240. The plurality of pillar interconnects 242 may be coupled to the integrated device 204 (e.g., pad interconnects of the integrated device 204). The plurality of solder interconnects 244 may be coupled to the plurality of pillar interconnects 242. In some implementations, the plurality of pillar interconnects 242 and/or the plurality of solder interconnects 244 may be considered part of the integrated device 204. The plurality of solder interconnects 244 may be coupled to plurality of interconnects 132 and/or the plurality of interconnects 152. The plurality of solder interconnects 224 may include a plurality of solder interconnects 244*a* and a plurality of solder interconnects 244*b*. In some implementations, there may not be a plurality of pillar interconnects 242. Thus, the plurality of solder interconnects 244 may be coupled to pad interconnects of the integrated device 204.

FIG. 3 illustrates that the depth of the openings in the solder resist layer 107 that are located over the interconnect block 110 is less than the dept of the openings in the solder resist layer 107 that are not located over the interconnect block 110. The openings in the solder resist layer 107 expose pad interconnects from the plurality of interconnects 132 and/or pad interconnects from the plurality of interconnects 152. These pad interconnects are coupled and touching the plurality of solder interconnects 224 and/or the plurality of solder interconnects 244.

As will be further described below, the integrated device 202 and the integrated device 204 may be configured to be electrically coupled to each other through the substrate 100 and the interconnect block 110. The interconnect block 110 includes at least one block dielectric layer 112 and a plurality of block interconnects 113. The plurality of block interconnects 113 may include block via interconnects, block pad interconnects and/or block trace interconnects. In some implementations, the plurality of block interconnects 113 may have a minimum width, a minimum space, a minimum pitch and/or minimum thickness that is less than the minimum width, the minimum space, the minimum pitch, and/or the minimum thickness of interconnects from the plurality of interconnects 132. For example, in some implementations, the block trace interconnects and/or the block pad interconnects from the plurality of block interconnects 113 may have a block thickness that is less than the thickness of pad interconnects and/or trace interconnects from the plurality of interconnects 132. In some implementations, some block pad interconnects and/or block trace interconnects may be on and/or share a same horizontal plane (e.g., imaginary horizontal plane) as via interconnects from the plurality of interconnects 132. In some implementations, a solder interconnect from the plurality of solder interconnects 224 and/or a solder interconnect from the plurality of solder interconnects 244 may be on and/or share a same horizontal plane (e.g., imaginary horizontal plane) as the dielectric layer 104*a*, interconnects from the plurality of interconnects 152. For example, a solder interconnect from the plurality of solder interconnects 224 may be on and/or share a same horizontal plane (e.g., imaginary horizontal plane) as via interconnects and/or pad interconnects from the plurality of interconnects 152.

FIG. 3 illustrates that some of the pad interconnects (from the plurality of interconnects 152) that are coupled to the plurality of solder interconnects (e.g., 224*b*, 244*b*) are located on a different metal layer than some of the pad interconnects (from the plurality of interconnects 132) that are coupled to the plurality of solder interconnects (e.g., 224*a*, 244*a*). The pad interconnects (from the plurality of interconnects 152) that are coupled to the plurality of solder interconnects (e.g., 224*b*, 244*b*) are located at a distance D1 from a first surface of the core layer. The pad interconnects (from the plurality of interconnects 132) that are coupled to the plurality of solder interconnects (e.g., 224*a*, 244*a*) are located at a distance D2 from the first surface of the core layer, where the distance D1 is greater than the distance D2. In some implementations, the size of the plurality of solder interconnects (e.g., 224*b*, 244*b*) is less than the size of the plurality of solder interconnects (e.g., 224*a*, 244*a*).

Thus, in some implementations, an interconnect block may include a first block interconnect on a first metal layer, and a second block interconnect on a second metal layer, and where the first block interconnect and/or the second block interconnect is/are located laterally on and/or share a same plane (e.g., imaginary horizontal plane) as a via interconnect from the plurality of interconnects.

In some implementations, a first surface of the at least one first dielectric layer located over the interconnect block is located away from a surface of the core layer by a first distance, and a second surface of the at least one first dielectric layer that is not located over the interconnect block is located away from the surface of the core layer by a second distance, where the first distance is greater than the second distance.

In some implementations, the plurality of interconnects 152 may have a minimum width, a minimum space, a minimum pitch and/or minimum thickness that is less than the minimum width, the minimum space, the minimum pitch, and/or the minimum thickness of interconnects from the plurality of interconnects 132. For example, in some implementations, the block trace interconnects and/or the block pad interconnects from the plurality of interconnects 152 may have a block thickness that is less than the thickness of pad interconnects and/or trace interconnects from the plurality of interconnects 132.

In some implementations, the block dielectric layer 112 may be considered part of the dielectric layer 104*a*, the dielectric layer 103*a* and/or the dielectric layer 102*a*. This may be the case, when the block dielectric layer 112 and the dielectric layer 104*a*, the dielectric layer 103*a*, and/or the dielectric layer 102*a* include the same material. In some implementations, the block dielectric layer 112 of the interconnect block 110 may not be distinguishable from one or more of the dielectric layers (e.g., the dielectric layer 104*a*, the dielectric layer 103*a*, and/or the dielectric layer 102*a*) of the substrate 100. For example, there may not be a boundary interface between the block dielectric layer 112 and the dielectric layer 104*a* and/or the dielectric layer 103*a*. In some implementations, the interconnect block 110 may be a structure and/or structural configuration that includes a plurality of block interconnects, where the block dielectric layer 112 may be a dielectric layer that is considered part of the substrate 100. In some implementations, the block dielectric layer 112 may be considered separate from the dielectric layer 104*a*, the dielectric layer 103*a* and/or the dielectric layer 102*a* (e.g., for example, there may be a boundary interface between the block dielectric layer 112 and the dielectric layer 104*a*). The block dielectric layer 112 may include the same material or a different material from the dielectric layer 104*a*, the dielectric layer 103*a* and/or the dielectric layer 102*a*. An interconnect block as used in the disclosure may mean to represent one or more components, a structure and/or a structural configuration of various components.

The use of the interconnect block 110 provides an effective structure for providing high density electrical paths between integrated devices, without increasing the overall thickness of the substrate 100, when the overall thickness of the substrate 100 includes the thicknesses of the solder resist layer 107 and/or the solder resist layer 109. The interconnect block 110 may be a step up interconnect structure that is at least partially embedded and/or at least partially located in the substrate 100. Moreover, the interconnect block 110 enables high density interconnects to be located in certain spaces and regions, that would otherwise not be possible.

Table 1 below illustrates exemplary minimum dimensions for various components of a package.

TABLE 1

Exemplary Minimum Dimensions

| COMPONENT | INTERCONNECT THICKNESS | DIELECTRIC LAYER THICKNESS | LINE | SPACE | BUMP PITCH | VIA DIAMETER |
|---|---|---|---|---|---|---|
| INTERCONNECTS 132 | 12-18 micrometers | 18-35 micrometers | 10-30 micrometers | 10-45 micrometers | — | 60 micrometers |
| BLOCK INTERCONNECTS 113 | 2-7 micrometers | — | 2-8 micrometers | 2-10 micrometers | — | 10-30 micrometers |
| BLOCK DIELECTRIC LAYER 112A/112B | — | 5-10 micrometers | — | — | — | — |
| INTERCONNECTS 152 | 10-15 micrometers | — | | | | 40-60 micrometers |
| SOLDER INTERCONNECTS 224/244 | 15-18 micrometers | — | | | | 110-150 micrometers |

The above dimensions for various components are merely exemplary minimum dimensions. In some implementations, the dimensions may be different and/or greater than the minimum dimensions listed. In some implementations, the minimum dimensions may be different, including being lower dimensions.

Figure 4:
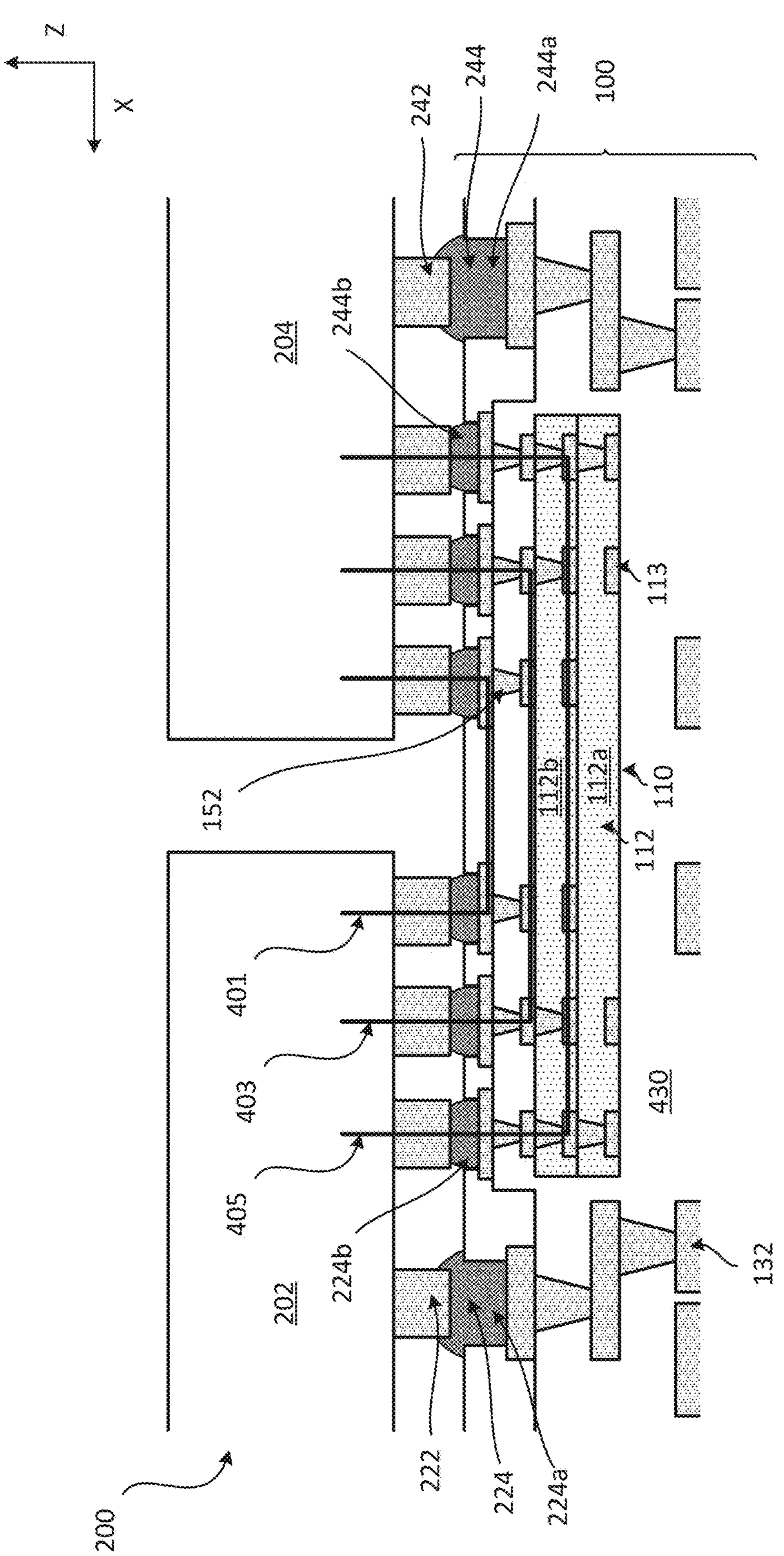
FIG. 4 illustrates a close up view of an example of a profile view of a package that includes an integrated device and a substrate with an interconnect block, where exemplary electrical paths are shown.

FIG. 4 illustrates a close up view of the package 200 that includes the substrate 100 comprising the interconnect block 110, with possible electrical paths shown. FIG. 4 illustrates that the substrate 100 includes at least one dielectric layer 430 and the interconnect block 110. The at least one dielectric layer 430 may represent the dielectric layer 102*a*, the dielectric layer 103*a* and/or the dielectric layer 104*a*. The interconnect block 110 is located at least partially in the at least one dielectric layer 430. FIG. 4 illustrates an electrical path 401, an electrical path 403 and an electrical path 405. The electrical path 401, the electrical path 403 and/or the electrical path 405 may be configured as electrical paths for input/output signals between integrated devices.

The electrical path 401 may be an electrical path between the integrated device 202 and the integrated device 204. The electrical path 401 may include (i) a pillar interconnect from the plurality of pillar interconnects 222, (ii) a solder interconnect from the plurality of solder interconnects 224, (iii) at least one interconnect from the plurality of interconnects 152, (iv) a solder interconnect from the plurality of solder interconnects 244, and/or (v) a pillar interconnect from the plurality of pillar interconnects 242.

The electrical path 403 may be an electrical path between the integrated device 202 and the integrated device 204. The electrical path 401 may include (i) a pillar interconnect from the plurality of pillar interconnects 222, (ii) a solder interconnect from the plurality of solder interconnects 224, (iii) at least one interconnect from the plurality of interconnects 152, (iv) at least one block interconnect from the plurality of block interconnects 113. (v) at least one other interconnect from the plurality of interconnects 152, (vi) a solder interconnect from the plurality of solder interconnects 244, and/or (vii) a pillar interconnect from the plurality of pillar interconnects 242.

The electrical path 405 may be an electrical path between the integrated device 202 and the integrated device 204. The electrical path 401 may include (i) a pillar interconnect from the plurality of pillar interconnects 222, (ii) a solder interconnect from the plurality of solder interconnects 224, (iii) at least one interconnect from the plurality of interconnects 152, (iv) at least one block interconnect from the plurality of block interconnects 113, (v) at least one other interconnect from the plurality of interconnects 152, (vi) a solder interconnect from the plurality of solder interconnects 244, and/or (vii) a pillar interconnect from the plurality of pillar interconnects 242. In some implementations, the electrical path 405 may be different from the electrical path 403 in that the electrical paths may travel through different metal layers of the interconnect block 110.

FIG. 4 illustrates that the solder interconnect 224*b* is coupled to a particular pad interconnect from the plurality of interconnects 152, where that particular pad interconnect may be on and/or share a same horizontal plane (e.g., imaginary horizontal plane) as the solder interconnect 224*a*. The solder interconnect 224*a* and the solder interconnect 224*b* are coupled to respective pad interconnects on different metal layers of the substrate 100. The solder interconnect 224*a* is coupled to a pad interconnect from the plurality of interconnects 132. The solder interconnect 224*a* may be on and/or share a same horizontal plane (e.g., imaginary horizontal plane) as a via interconnect from the plurality of interconnects 152.

FIG. 4 also illustrates that the solder interconnect 244*b* is coupled to a particular pad interconnect from the plurality of interconnects 152, where the particular pad interconnect may be on and/or share a same horizontal plane (e.g., imaginary horizontal plane) as the solder interconnect 244*a*. The solder interconnect 244*a* and the solder interconnect 244*b* are coupled to respective pad interconnects on different metal layers of the substrate 100. The solder interconnect 244*a* is coupled to a pad interconnect from the plurality of interconnects 132. The solder interconnect 244*a* may be on and/or share a same horizontal plane (e.g., imaginary horizontal plane) as a via interconnect from the plurality of interconnects 152.

An integrated device may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc. . . . ). An integrated device may include transistors. An integrated device may be an example of an electrical component and/or electrical device. In some implementations, an integrated device may include a chiplet. A chiplet may be fabricated using a process that provides better yields compared to other processes that are used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that perform several functions may reduce the overall cost of a package relative to using a single chip to perform all of the functions of a package.

As mentioned above, in some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 202, 204) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, a first integrated device and a second integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating a Substrate Comprising an Interconnect Block

FIGS. 5A-5G illustrate an exemplary sequence for providing or fabricating a substrate comprising an interconnect block. In some implementations, the sequence of FIGS. 5A-5G may be used to provide or fabricate any of the substrates described in the disclosure. In some implementations, the sequence of FIGS. 5A-5G may be used to provide or fabricate the substrate 100 described in the disclosure.

It should be noted that the sequence of FIGS. 5A-5G may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure. Different implementations may fabricate a substrate differently.

Figure 5A:
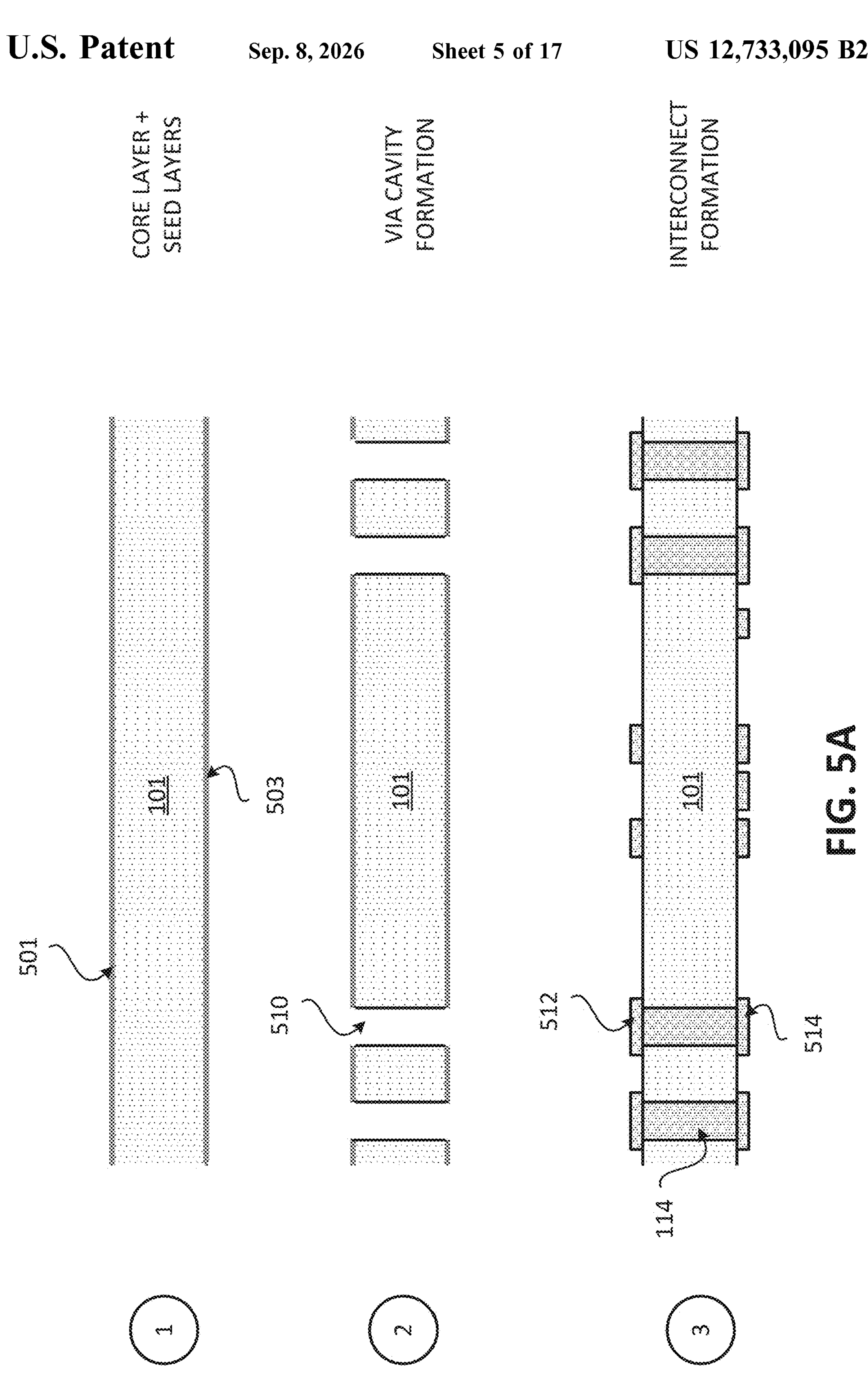
FIGS. 5A-5G illustrate an exemplary sequence for fabricating a substrate with an interconnect block.

Stage 1, as shown in FIG. 5A, illustrates a state after a core layer 101 is provided. The core layer 101 may include a seed layer 501 coupled to a first surface of the core layer 101, and a seed layer 503 to a second surface of the core layer 101. The seed layer 501 and/or the seed layer 503 may include metal, such as copper.

Stage 2 illustrates a state after a plurality of cavities 510 (e.g., via cavities) are formed in the core layer 101. The plurality of cavities 510 may be formed through the seed layer 501 and the seed layer 503. A laser process (e.g., laser ablation) may be used to form the plurality of cavities 510. However, different implementations may use different processes to form the plurality of cavities 510. The plurality of cavities 510 may extend through the thickness of the core layer 101, the seed layer 501 and/or the seed layer 503.

Stage 3 illustrates a state after a plurality of via interconnects 114 are formed. The plurality of via interconnects 114 may be formed in the plurality of cavities 510. A plating process and a patterning process may be used to form the plurality of via interconnects 114. In some implementations, a part of the plurality of cavities 510 are filled with the plurality of via interconnects 114 and a plurality of fills may be provided in the remainder of the plurality of cavities 510.

Stage 3 also illustrates a state after a plurality of interconnects 512 and a plurality of interconnects 514 are formed. The plurality of interconnects 512 may be formed and coupled to a first surface of the core layer 101. In some implementations, part of the seed layer 501 may be part of the plurality of interconnects 512. The plurality of interconnects 512 may be coupled to the plurality of via interconnects 114. The plurality of interconnects 514 may be formed and coupled to a second surface of the core layer 101. In some implementations, part of the seed layer 503 may be part of the plurality of interconnects 514. The plurality of interconnects 514 may be coupled to the plurality of via interconnects 114. A plating process and a patterning process may be used to form the plurality of interconnects 512 and/or the plurality of interconnects 514.

Figure 5B:
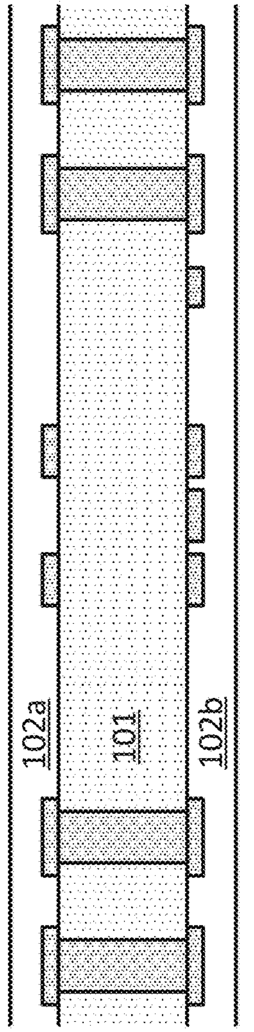
Figure 5B:
Figure 5B:
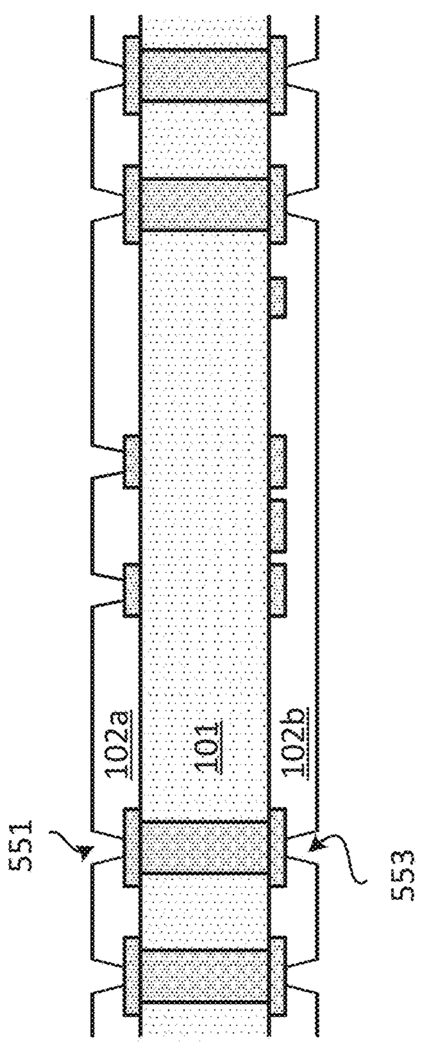
Figure 5B:

Stage 4, as shown in FIG. 5B, illustrates a state after a dielectric layer **102*a* and the dielectric layer 102*b* are formed. The dielectric layer 102*a* may be coupled to a first surface of the core layer 101. The dielectric layer 102*a* may cover the plurality of interconnects 512. The dielectric layer 102*b* may be coupled to a second surface of the core layer 101. The dielectric layer 102*b* may cover the plurality of interconnects 514. A deposition process and/or a lamination process may be used to form the dielectric layer 102*a* and/or the dielectric layer 102*b*. In some implementations, the dielectric layer 102*a* and/or the dielectric layer 102*b* may include a polymer. In some implementations, the dielectric layer 102*a* and/or the dielectric layer 102*b* may include Ajinomoto Build-up Film (ABF). In some implementations, the dielectric layer 102*a* and/or the dielectric layer 102*b* may include prepreg. The dielectric layer 102*a* and/or the dielectric layer 102*b* may include the same or different dielectric material from the core layer 101**.

Stage 5 illustrates a state after a plurality of cavities 551 are formed through a surface (e.g., first surface, top surface) of the dielectric layer **102*a*. The plurality of cavities 551 may expose part of the plurality of interconnects 512. Stage 5 also illustrates a state after a plurality of cavities 553 are formed through a surface (e.g., second surface, bottom surface) of the dielectric layer 102*b*. The plurality of cavities 553 may expose part of the plurality of interconnects 514. In some implementations, an exposure process and a development process may be used to form the plurality of cavities 551 and/or the plurality of cavities 553. In some implementations, a laser process (e.g., laser ablation process) may be used to form the plurality of cavities 551 in the dielectric layer 102*a* and the plurality of cavities 553 in the dielectric layer 102*b*. However, different implementations may use different processes to form the plurality of cavities 551 and/or the plurality of cavities 553**.

Figure 5C:
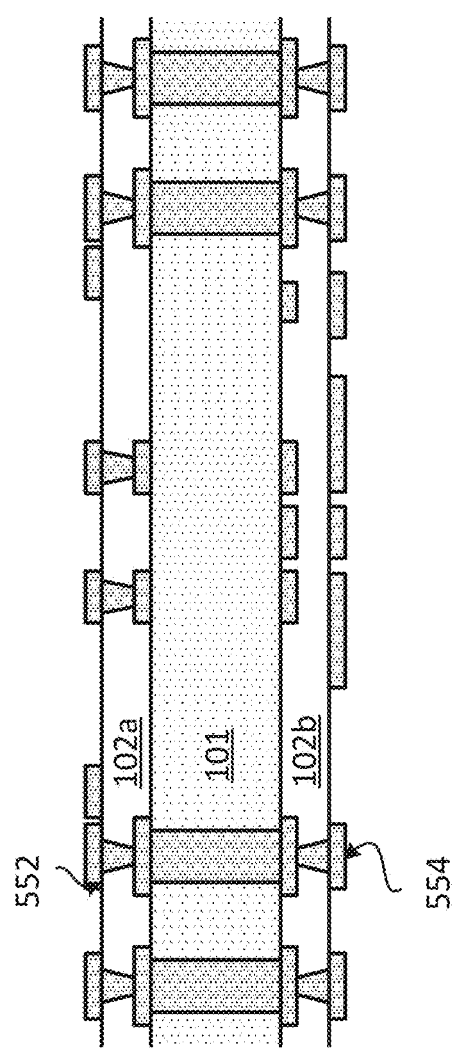
Figure 5C:
Figure 5C:
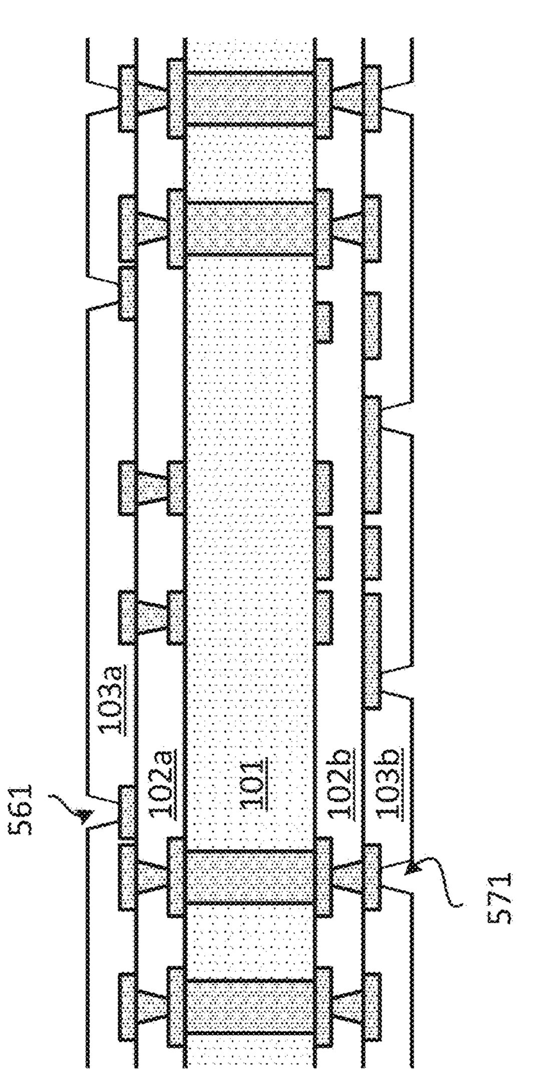
Figure 5C:

Stage 6, as shown in FIG. 5C, illustrates a state after a plurality of interconnects 552 are formed in the at least one dielectric layer **102*a* and a plurality of interconnects 554 are formed in at least the dielectric layer 102*b*. The plurality of interconnects 552 may be coupled to the plurality of interconnects 512. The plurality of interconnects 554 may be coupled to the plurality of interconnects 514. A plating process may be used to form the plurality of interconnects 552 and/or the plurality of interconnects 554**.

Stage 7 illustrates a state after a dielectric layer **103*a* and the dielectric layer 103*b* are formed. The dielectric layer 103*a* may include a plurality of cavities 561. The dielectric layer 103*b* may include a plurality of cavities 571. The dielectric layer 103*a* may be formed and coupled to a first surface (e.g., top surface) of the dielectric layer 102*a*. The dielectric layer 103*b* may be formed and coupled to a second surface (e.g., bottom surface) of the dielectric layer 103*b*. In some implementations, the dielectric layer 103*a* and/or the dielectric layer 103*b* may include a polymer. In some implementations, the dielectric layer 103*a* and/or the dielectric layer 103*b* may include Ajinomoto Build-up Film (ABF). In some implementations, the dielectric layer 103*a* and/or the dielectric layer 103*b* may include prepreg. The dielectric layer 103***a* and/or the dielectric layer 103*b* may be the same or different from the dielectric layer 102*a* and/or the dielectric layer 102*b*. A deposition process and/or a lamination process may be used to form the dielectric layer 103*a* and/or the dielectric layer 103*b*.

The plurality of cavities 561 are formed through a surface (e.g., first surface, top surface) of the dielectric layer 103*a*. In some implementations, an exposure process and/or a development process may be used to form the plurality of cavities 561. In some implementations, a laser process (e.g., laser ablation process) may be used to form the plurality of cavities 561 in the dielectric layer 103*a*. However, different implementations may use different processes to form the plurality of cavities 561. The plurality of cavities 571 are formed through a surface (e.g., second surface, bottom surface) of the dielectric layer 103*b*. In some implementations, an exposure process and/or a development process may be used to form the plurality of cavities 571. In some implementations, a laser process (e.g., laser ablation process) may be used to form the plurality of cavities 571 in the dielectric layer 103*b*. However, different implementations may use different processes to form the plurality of cavities 571.

In some implementations, the dielectric layer 103*a*, the dielectric layer 103*b*, the plurality of cavities 561 and/or the plurality of cavities 571 may be formed through a deposition process, a lamination process, an exposure process and/or a development process.

Figure 5D:
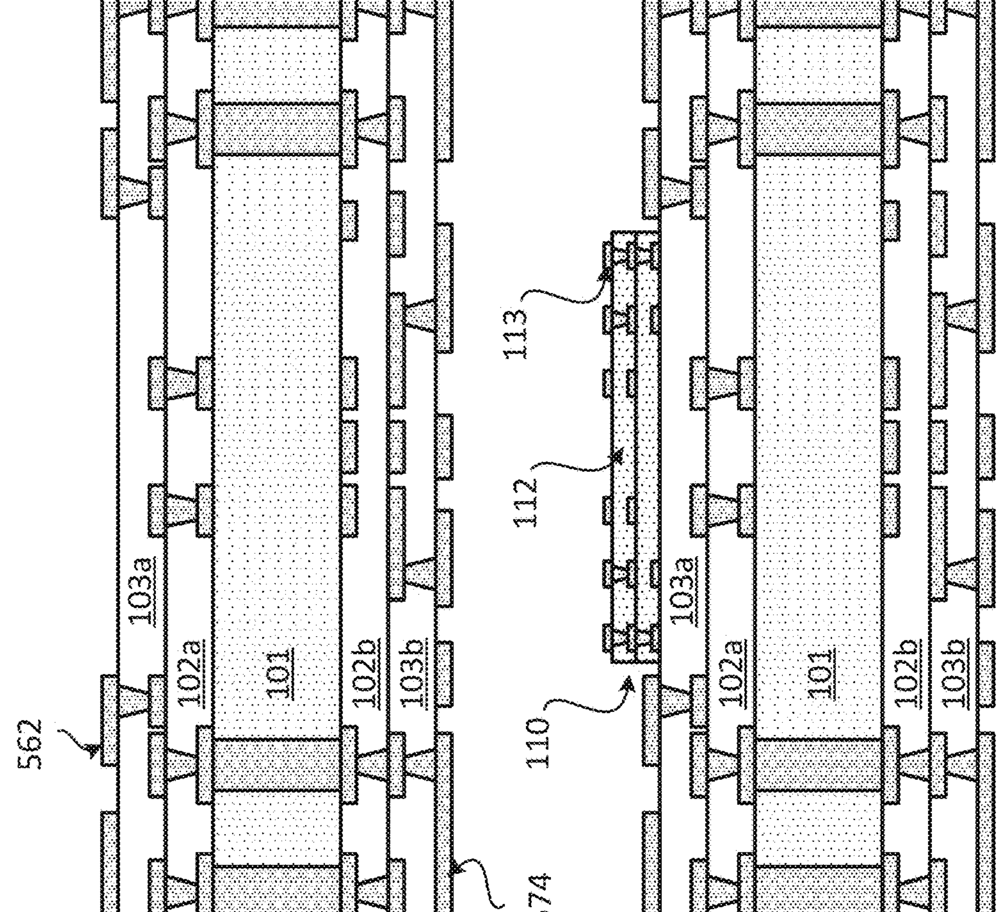

Stage 8, as shown in FIG. 5D, illustrates a state after a plurality of interconnects 562 are formed in at least the dielectric layer 103*a*. The plurality of interconnects 562 are coupled to the plurality of interconnects 552. Stage 8 also illustrates and describes a state after a plurality of interconnects 574 are formed in at least the dielectric layer 103*b*. The plurality of interconnects 574 are coupled to the plurality of interconnects 554. A plating process and a patterning process may be used to form the plurality of interconnects 562 and/or the plurality of interconnects 574.

Stage 9 illustrates a state after the interconnect block 110 is coupled to a surface of the dielectric layer 103*a*. The interconnect block 110 may include at least one block dielectric layer 112 and a plurality of block interconnects 113. The at least one block dielectric layer 112 may include material that is similar and/or different from the dielectric layer 103*a*. The plurality of block interconnects 113 may include a minimum width, a minimum space, a minimum pitch, and/or a minimum thickness that is less than the a minimum width, a minimum space, a minimum pitch, and/or a minimum thickness of the plurality of interconnects 512, the plurality of interconnects 552 and/or the plurality of interconnects 562. A lamination process may be used to couple the interconnect block 110 to the dielectric layer 103*a*.

Figure 5E:
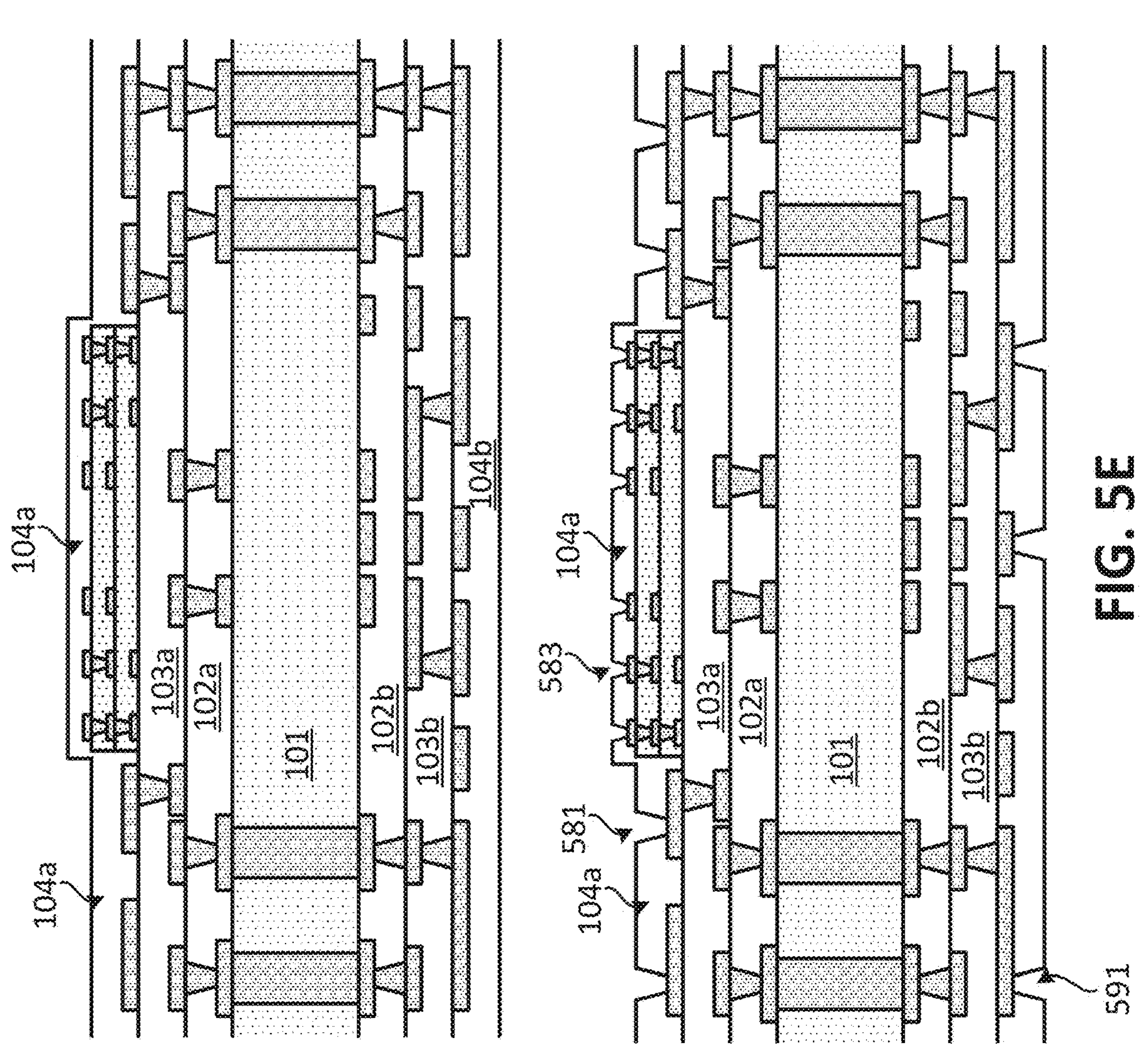

Stage 10, as shown in FIG. 5E, illustrates a state after a dielectric layer 104*a* and a dielectric layer 104*b* are formed. The dielectric layer 104*a* may be formed and coupled to a first surface (e.g., top surface) of the dielectric layer 103*a*. The dielectric layer 104*a* may be formed around and over the interconnect block 110. The dielectric layer 104*b* may be formed and coupled to a second surface (e.g., bottom surface) of the dielectric layer 103*b*. In some implementations, the dielectric layer 104*a* and/or the dielectric layer 104*b* may include a polymer. In some implementations, the dielectric layer 104*a* and/or the dielectric layer 104*b* may include Ajinomoto Build-up Film (ABF). In some implementations, the dielectric layer 104*a* and/or the dielectric layer 104*b* may include prepreg. The dielectric layer 104*a* and/or the dielectric layer 104*b* may be the same or different from the dielectric layer 102*a*, the dielectric layer 102*b*, the dielectric layer 103*a* and/or the dielectric layer 103*b*.

The dielectric layer 104*a* may form a step shape over the interconnect block 110. For example, the dielectric layer 104*a* may have (i) a first horizontal surface that is approximately parallel to a surface of the core layer 101, and (ii) a second horizontal surface that is approximately parallel to the same surface of the core layer 101, where the distance between the second horizontal surface of the dielectric layer 104*a* and a first surface of the core layer 101 is greater than the distance between the first horizontal surface of the dielectric layer 104*a*. The first horizontal surface of the dielectric layer 104*a* may be a surface that does not vertically overlap with the interconnect block 110, and the second horizontal surface of the dielectric layer 104*a* may be a surface that vertically overlaps with the interconnect block 110.

Stage 11 illustrates a state after a plurality of cavities 581 and a plurality of cavities 583 are formed in the dielectric layer 104*a*. The plurality of cavities 581 are formed through a surface (e.g., first surface, top surface) of the dielectric layer 104*a* that does not vertically overlap with the interconnect block 110. The plurality of cavities 583 are formed through a surface (e.g., first surface, top surface) of the dielectric layer 104*a* that vertically overlap with the interconnect block 110. A laser process (e.g., laser ablation process) may be used to form the plurality of cavities 581 and/or the plurality of cavities 583 in the dielectric layer 104*a*. However, different implementations may use different processes to form the plurality of cavities 581 and/or the plurality of cavities 583.

Stage 11 also illustrates a state after the plurality of cavities 591 are formed through a surface (e.g., second surface, bottom surface) of the dielectric layer 104*b*. A laser process (e.g., laser ablation process) may be used to form the plurality of cavities 591 in the dielectric layer 104*b*. However, different implementations may use different processes to form the plurality of cavities 591. In some implementations, the dielectric layer 104*a*, the dielectric layer 104*b*, the plurality of cavities 581, the plurality of cavities 583 and/or the plurality of cavities 591 may be formed through a deposition process, a lamination process, an exposure process and/or a development process.

Figure 5F:
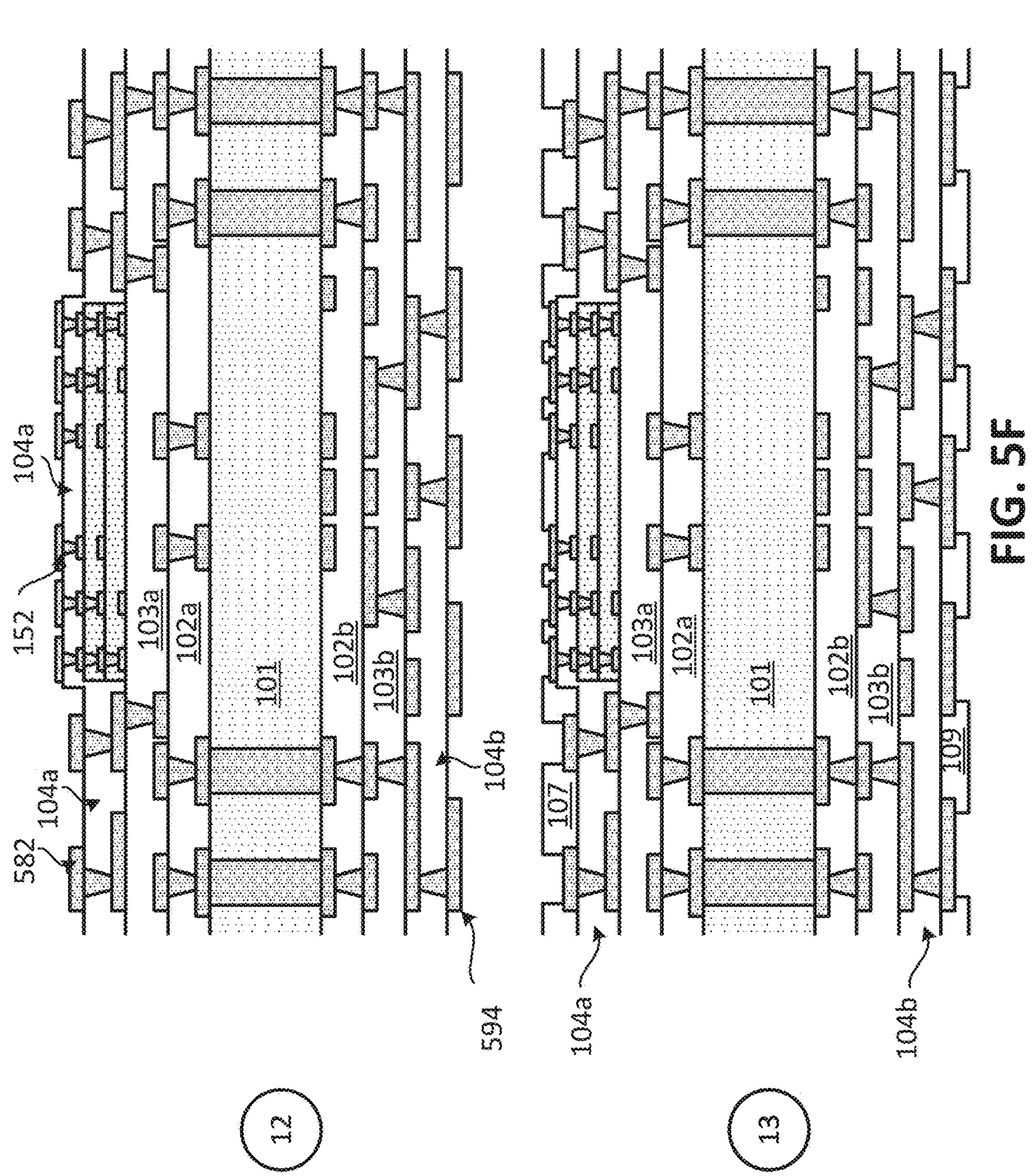

Stage 12, as show in FIG. 5F, illustrates a state after a plurality of interconnects 582 and a plurality of interconnects 152 are formed in at least the dielectric layer 104*a*. The plurality of interconnects 582 are coupled to the plurality of interconnects 562. The plurality of interconnects 152 are coupled to the plurality of block interconnects 113. Stage 12 also illustrates and describes a state after a plurality of interconnects 594 are formed in at least the dielectric layer 104*b*. The plurality of interconnects 594 are coupled to the plurality of interconnects 574. A plating process and a patterning process may be used to form the plurality of interconnects 582 and/or the plurality of interconnects 594. It is noted that the block dielectric layer 112 of the interconnect block 110 may be indistinguishable from the dielectric layer 102*a*, the dielectric layer 103*a* and/or the dielectric layer 104*a*. In such instance, (i) the block dielectric layer 112 may be considered part of the dielectric layer 102*a*, the dielectric layer 103*a* and/or the dielectric layer 104*a*, and/or (ii) the interconnect block 110 may represent a region of the substrate 100 and/or is part of a region of the substrate 100 that includes the plurality of block interconnects 113 and/or the plurality of interconnects 152. Thus, in some implementations, when the block dielectric layer 112 is indistinguishable from the dielectric layer 102*a*, the dielectric layer 103*a* and/or the dielectric layer 104*a* (e.g., when same material is used), the interconnect block may represent the plurality of block interconnects 113 and/or the plurality of interconnects 152, and the block dielectric layer 112 may be considered a dielectric layer of the substrate 100.

Stage 13 illustrates a state after a solder resist layer 107 is formed and patterned. The solder resist layer 107 may be coupled to the dielectric layer 104*a* and the dielectric layer 105. A deposition, a lamination, an exposure, a development and/or an etching process may be used to form and pattern the solder resist layer 107. Different portions of the solder resist layer 107 may have different thickness. For example, portions of the solder resist layer 107 that vertically overlap with the interconnect block 110 may have a thickness than is less than the thickness of portions of the solder resist layer 107 that do not vertically overlap with interconnect block 110. Portions of the solder resist layer 107 may touch the side wall of the interconnect block 110. For example, portions of the solder resist layer 107 may touch the side wall of the at least one block dielectric layer 112 of the interconnect block 110.

Stage 13 also illustrates and describes a state after a solder resist layer 109 is formed and patterned. The solder resist layer 109 may be coupled to the dielectric layer 104*b*. A deposition, a lamination, an exposure, a development and/or an etching process may be used to form and pattern the solder resist layer 109. Stage 13 may illustrate the substrate 100 that includes an interconnect block 110.

Stage 14 illustrates a state after a plurality of solder interconnects 290 are coupled to interconnects of the substrate 100. For example, the plurality of solder interconnects 290 may be coupled to the plurality of interconnects 594. A solder reflow process may be used to couple the plurality of solder interconnects 290 to the substrate. Stage 15 may illustrate the substrate 100 that includes an interconnect block 110 and a plurality of solder interconnects 290.

Figure 6:
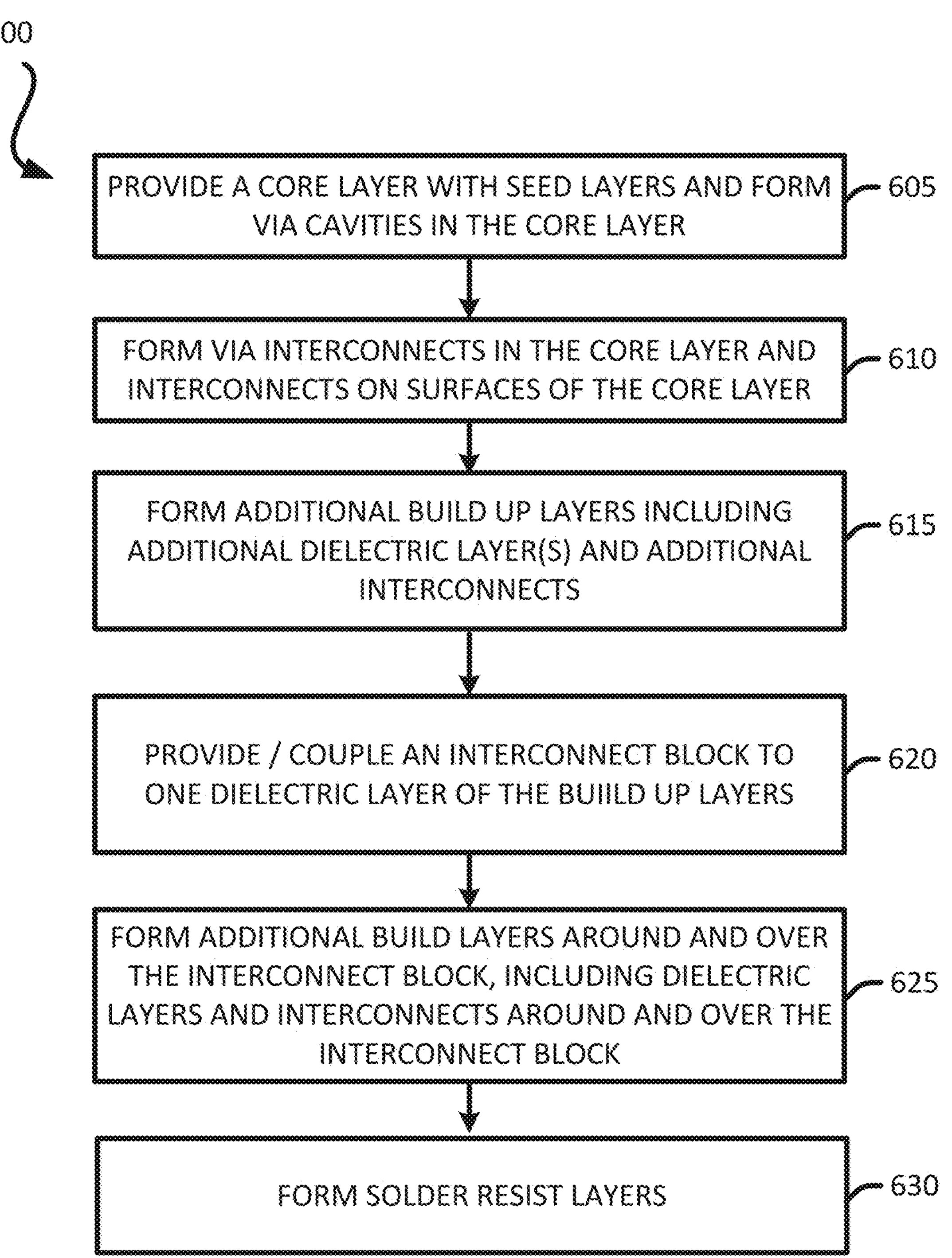
FIG. 6 illustrates an exemplary sequence for fabricating a substrate with an interconnect block.

Exemplary Flow Diagram of a Method for Fabricating a Substrate with an Interconnect Block In some implementations, fabricating a substrate includes several processes. FIG. 6 illustrates an exemplary flow diagram of a method 600 for providing or fabricating a substrate with an interconnect block. In some implementations, the method 600 of FIG. 6 may be used to provide or fabricate the substrate 100.

It should be noted that the method 600 of FIG. 6 may combine one or more processes in order to simplify and/or clarify the method for providing or fabricating a substrate. In some implementations, the order of the processes may be changed or modified.

The method provides (at 605) a core layer with seed layers and forms cavities (e.g., via cavities) in the core layer through the seed layer. Stage 1 of FIG. 5A, illustrates and describes an example of a state after a core layer 101 is provided. The core layer 101 may include a seed layer 501 coupled to a first surface of the core layer 101, and a seed layer 503 to a second surface of the core layer 101. The seed layer 501 and/or the seed layer 503 may include metal, such as copper.

Stage 2 of FIG. 5A, illustrates and describes an example of a state after a plurality of cavities 510 (e.g., via cavities) are formed in the core layer 101. The plurality of cavities 510 may be formed through the seed layer 501 and the seed layer 503. A laser process (e.g., laser ablation) may be used to form the plurality of cavities 510. However, different implementations may use different processes to form the plurality of cavities 510. The plurality of cavities 510 may extend through the thickness of the core layer 101, the seed layer 501 and/or the seed layer 503.

The method forms (at 610) a plurality of via interconnects that extend through the core layer and interconnects on the surfaces of the core layer. Stage 3 of FIG. 5A, illustrates and describes an example of a state after a plurality of via interconnects 114 are formed. The plurality of via interconnects 114 may be formed in the plurality of cavities 510. A plating process and a patterning process may be used to form the plurality of via interconnects 114. In some implementations, a part of the plurality of cavities 510 are filled with the plurality of via interconnects 114 and a plurality of fills may be provided in the remainder of the plurality of cavities 510.

Stage 3 of FIG. 5A, also illustrates and describes an example of a state after a plurality of interconnects 512 and a plurality of interconnects 514 are formed. The plurality of interconnects 512 may be formed and coupled to a first surface of the core layer 101. In some implementations, part of the seed layer 501 may be part of the plurality of interconnects 512. The plurality of interconnects 512 may be coupled to the plurality of via interconnects 114. The plurality of interconnects 514 may be formed and coupled to a second surface of the core layer 101. In some implementations, part of the seed layer 503 may be part of the plurality of interconnects 514. The plurality of interconnects 514 may be coupled to the plurality of via interconnects 114. A plating process and a patterning process may be used to form the plurality of interconnects 512 and/or the plurality of interconnects 514.

The method forms (at 615) build up layers that are coupled to the core layer, where the build up layers may include at least one dielectric layer and a plurality of interconnects. Stage 4 of FIG. 5B through stage 8 of FIG. 5D, illustrate and describe an example of forming build up layers.

Stage 4 of FIG. 5B, illustrates and describes an example of a state after a dielectric layer 102*a* and the dielectric layer 102*b* are formed. The dielectric layer 102*a* may be coupled to a first surface of the core layer 101. The dielectric layer 102*a* may cover the plurality of interconnects 512. The dielectric layer 102*b* may be coupled to a second surface of the core layer 101. The dielectric layer 102*b* may cover the plurality of interconnects 514. A deposition process and/or a lamination process may be used to form the dielectric layer 102*a* and/or the dielectric layer 102*b*. In some implementations, the dielectric layer 102*a* and/or the dielectric layer 102*b* may include a polymer. In some implementations, the dielectric layer 102*a* and/or the dielectric layer 102*b* may include Ajinomoto Build-up Film (ABF). In some implementations, the dielectric layer 102*a* and/or the dielectric layer 102*b* may include prepreg. The dielectric layer 102*a* and/or the dielectric layer 102*b* may include the same or different dielectric material from the core layer 101.

Stage 5 of FIG. 5B, illustrates and describes an example of a state after a plurality of cavities 551 are formed through a surface (e.g., first surface, top surface) of the dielectric layer 102*a*. The plurality of cavities 551 may expose part of the plurality of interconnects 512. Stage 5 also illustrates a state after a plurality of cavities 553 are formed through a surface (e.g., second surface, bottom surface) of the dielectric layer 102*b*. The plurality of cavities 553 may expose part of the plurality of interconnects 514. In some implementations, an exposure process and a development process may be used to form the plurality of cavities 551 and/or the plurality of cavities 553. In some implementations, a laser process (e.g., laser ablation process) may be used to form the plurality of cavities 551 in the dielectric layer 102*a* and the plurality of cavities 553 in the dielectric layer 102*b*. However, different implementations may use different processes to form the plurality of cavities 551 and/or the plurality of cavities 553.

Stage 6 of FIG. 5C, illustrates and describes an example of a state after a plurality of interconnects 552 are formed in the at least one dielectric layer 102*a* and a plurality of interconnects 554 are formed in at least the dielectric layer 102*b*. The plurality of interconnects 552 may be coupled to the plurality of 512. The plurality of interconnects 554 may be coupled to the plurality of interconnects 514. A plating process may be used to form the plurality of interconnects 552 and/or the plurality of interconnects 554.

Stage 7 of FIG. 5C, illustrates and describes an example of a state after a dielectric layer 103*a* and the dielectric layer 103*b* are formed. The dielectric layer 103*a* may include a plurality of cavities 561. The dielectric layer 103*b* may include a plurality of cavities 571. The dielectric layer 103*a* may be formed and coupled to a first surface (e.g., top surface) of the dielectric layer 102*a*. The dielectric layer 103*b* may be formed and coupled to a second surface (e.g., bottom surface) of the dielectric layer 103*b*. In some implementations, the dielectric layer 103*a* and/or the dielectric layer 103*b* may include a polymer. In some implementations, the dielectric layer 103*a* and/or the dielectric layer 103*b* may include Ajinomoto Build-up Film (ABF). In some implementations, the dielectric layer 103*a* and/or the dielectric layer 103*b* may include prepreg. The dielectric layer 103*a* and/or the dielectric layer 103*b* may be the same or different from the dielectric layer 102*a* and/or the dielectric layer 102*b*. A deposition process and/or a lamination process may be used to form the dielectric layer 103*a* and/or the dielectric layer 103*b*.

The plurality of cavities 561 are formed through a surface (e.g., first surface, top surface) of the dielectric layer 103*a*. In some implementations, an exposure process and/or a development process may be used to form the plurality of cavities 561. In some implementations, a laser process (e.g., laser ablation process) may be used to form the plurality of cavities 561 in the dielectric layer 103*a*. However, different implementations may use different processes to form the plurality of cavities 561. The plurality of cavities 571 are formed through a surface (e.g., second surface, bottom surface) of the dielectric layer 103*b*. In some implementations, an exposure process and/or a development process may be used to form the plurality of cavities 571. In some implementations, a laser process (e.g., laser ablation process) may be used to form the plurality of cavities 571 in the dielectric layer 103*b*. However, different implementations may use different processes to form the plurality of cavities 571.

In some implementations, the dielectric layer 103*a*, the dielectric layer 103*b*, the plurality of cavities 561 and/or the plurality of cavities 571 may be formed through a deposition process, a lamination process, an exposure process and/or a development process.

Stage 8 of FIG. 5D, illustrates and describes an example of a state after a plurality of interconnects 562 are formed in at least the dielectric layer 103*a*. The plurality of interconnects 562 are coupled to the plurality of interconnects 552. Stage 8 also illustrates and describes a state after a plurality of interconnects 574 are formed in at least the dielectric layer 103*b*. The plurality of interconnects 574 are coupled to the plurality of interconnects 554. A plating process and a patterning process may be used to form the plurality of interconnects 562 and/or the plurality of interconnects 574.

The method provides (at 620) an interconnect block that is coupled to a dielectric layer. Stage 9 of FIG. 5D, illustrates and describes an example of a state after the interconnect block 110 is coupled to a surface of the dielectric layer 103*a*. The interconnect block 110 may include at least one block dielectric layer 112 and a plurality of block interconnects 113. The at least one block dielectric layer 112 may include material that is similar and/or different from the dielectric layer 103*a*. The plurality of block interconnects 113 may include a minimum width, a minimum space, a minimum pitch, and/or a minimum thickness that is less than the a minimum width, a minimum space, a minimum pitch, and/or a minimum thickness of the plurality of interconnects 512, the plurality of interconnects 552 and/or the plurality of interconnects 562. A lamination process may be used to couple the interconnect block 110 to the dielectric layer 103*a*.

The method forms (at 625) at least one dielectric layer and a plurality of interconnects, around and over the interconnect block. Stage 10 of FIG. 5E through stage 12 of FIG. 5F, illustrates an example of forming at least one dielectric layer and a plurality of interconnects, around and over the interconnect block. Stage 10 of FIG. 5E, illustrates and describes an example of a state after a dielectric layer 104*a* and a dielectric layer 104*b* are formed. The dielectric layer 104*a* may be formed and coupled to a first surface (e.g., top surface) of the dielectric layer 103*a*. The dielectric layer 104*a* may be formed around and over the interconnect block 110. The dielectric layer 104*b* may be formed and coupled to a second surface (e.g., bottom surface) of the dielectric layer 103*b*. In some implementations, the dielectric layer 104*a* and/or the dielectric layer 104*b* may include a polymer. In some implementations, the dielectric layer 104*a* and/or the dielectric layer 104*b* may include Ajinomoto Build-up Film (ABF). In some implementations, the dielectric layer 104*a* and/or the dielectric layer 104*b* may include prepreg. The dielectric layer 104*a* and/or the dielectric layer 104*b* may be the same or different from the dielectric layer 102*a*, the dielectric layer 102*b*, the dielectric layer 103*a* and/or the dielectric layer 103*b*.

The dielectric layer 104*a* may form a step shape over the interconnect block 110. For example, the dielectric layer 104*a* may have (i) a first horizontal surface that is approximately parallel to a surface of the core layer 101, and (ii) a second horizontal surface that is approximately parallel to the same surface of the core layer 101, where the distance between the second horizontal surface of the dielectric layer 104*a* and a first surface of the core layer 101 is greater than the distance between the first horizontal surface of the dielectric layer 104*a*. The first horizontal surface of the dielectric layer 104*a* may be a surface that does not vertically overlap with the interconnect block 110, and the second horizontal surface of the dielectric layer 104*a* may be a surface that vertically overlaps with the interconnect block 110.

Stage 11 of FIG. 5E, illustrates and describes an example of a state after a plurality of cavities 581 and a plurality of cavities 583 are formed in the dielectric layer 104*a*. The plurality of cavities 581 are formed through a surface (e.g., first surface, top surface) of the dielectric layer 104*a* that does not vertically overlap with the interconnect block 110. The plurality of cavities 583 are formed through a surface (e.g., first surface, top surface) of the dielectric layer 104*a* that vertically overlap with the interconnect block 110. A laser process (e.g., laser ablation process) may be used to form the plurality of cavities 581 and/or the plurality of cavities 583 in the dielectric layer 104*a*. However, different implementations may use different processes to form the plurality of cavities 581 and/or the plurality of cavities 583.

Stage 11 of FIG. 5E, also illustrates and describes an example of a state after the plurality of cavities 591 are formed through a surface (e.g., second surface, bottom surface) of the dielectric layer 104*b*. A laser process (e.g., laser ablation process) may be used to form the plurality of cavities 591 in the dielectric layer 104*b*. However, different implementations may use different processes to form the plurality of cavities 591. In some implementations, the dielectric layer 104*a*, the dielectric layer 104*b*, the plurality of cavities 581, the plurality of cavities 583 and/or the plurality of cavities 591 may be formed through a deposition process, a lamination process, an exposure process and/or a development process.

Stage 12 of FIG. 5F, illustrates and describes an example of a state after a plurality of interconnects 582 and a plurality of interconnects 152 are formed in at least the dielectric layer 104*a*. The plurality of interconnects 582 are coupled to the plurality of interconnects 562. The plurality of interconnects 152 are coupled to the plurality of block interconnects 113. Stage 12 also illustrates and describes a state after a plurality of interconnects 594 are formed in at least the dielectric layer 104*b*. The plurality of interconnects 594 are coupled to the plurality of interconnects 574. A plating process and a patterning process may be used to form the plurality of interconnects 582 and/or the plurality of interconnects 594.

The method forms (at 630) at least one solder resist layer. Stage 13 of FIG. 5F, illustrates and describes an example of a state after a solder resist layer 107 is formed and patterned. The solder resist layer 107 may be coupled to the dielectric layer 104*a*. A deposition, a lamination, an exposure, a development and/or an etching process may be used to form and pattern the solder resist layer 107. Different portions of the solder resist layer 107 may have different thickness. For example, portions of the solder resist layer 107 that vertically overlap with the interconnect block 110 may have a thickness than is less than the thickness of portions of the solder resist layer 107 that do not vertically overlap with interconnect block 110. Portions of the solder resist layer 107 may touch the side wall of the interconnect block 110. For example, portions of the solder resist layer 107 may touch the side wall of the at least one block dielectric layer 112 of the interconnect block 110.

Stage 13 of FIG. 5F, also illustrates and describes an example of a state after a solder resist layer 109 is formed and patterned. The solder resist layer 109 may be coupled to the dielectric layer 104*b*. A deposition, a lamination, an exposure, a development and/or an etching process may be used to form and pattern the solder resist layer 109. Stage 14 may illustrate the substrate 100 that includes an interconnect block 110.

Figure 5G:
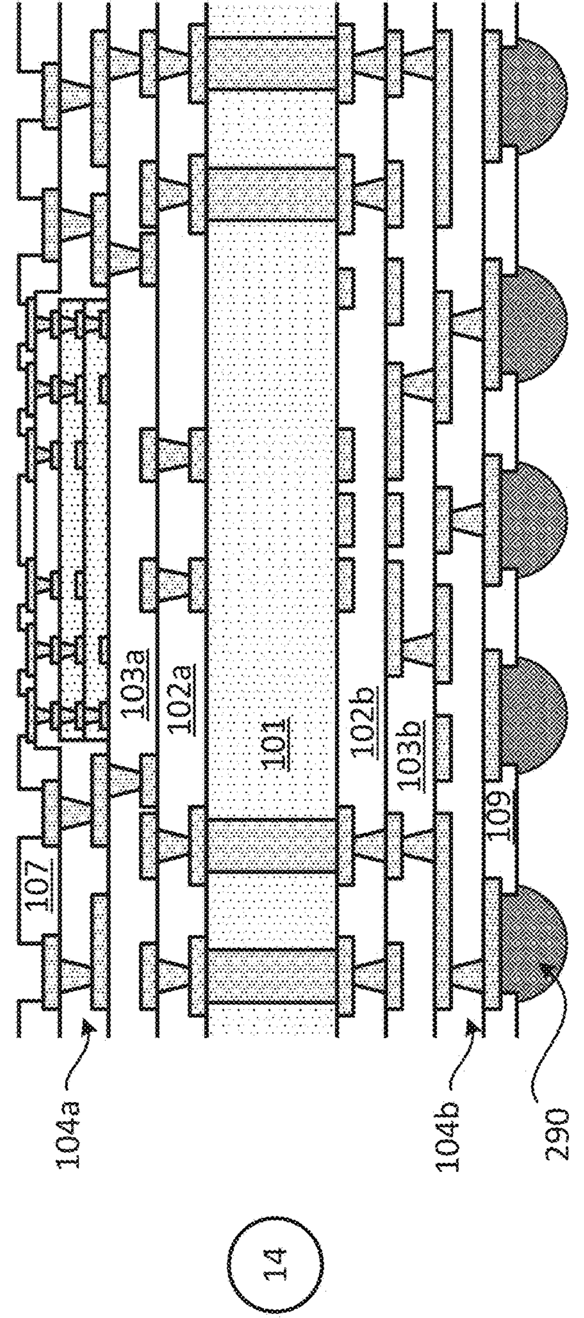

The method couples (at 635) a plurality of solder interconnects to the substrate. Stage 14 of FIG. 5G, illustrates and describes an example of a state after a plurality of solder interconnects 290 are coupled to interconnects of the substrate 100. For example, the plurality of solder interconnects 290 may be coupled to the plurality of interconnects 594. A solder reflow process may be used to couple the plurality of solder interconnects 290 to the substrate. Stage 15 may illustrate the substrate 100 that includes an interconnect block 110 and a plurality of solder interconnects 290.

Exemplary Sequence for Fabricating an Interconnect Block

Figure 7A:
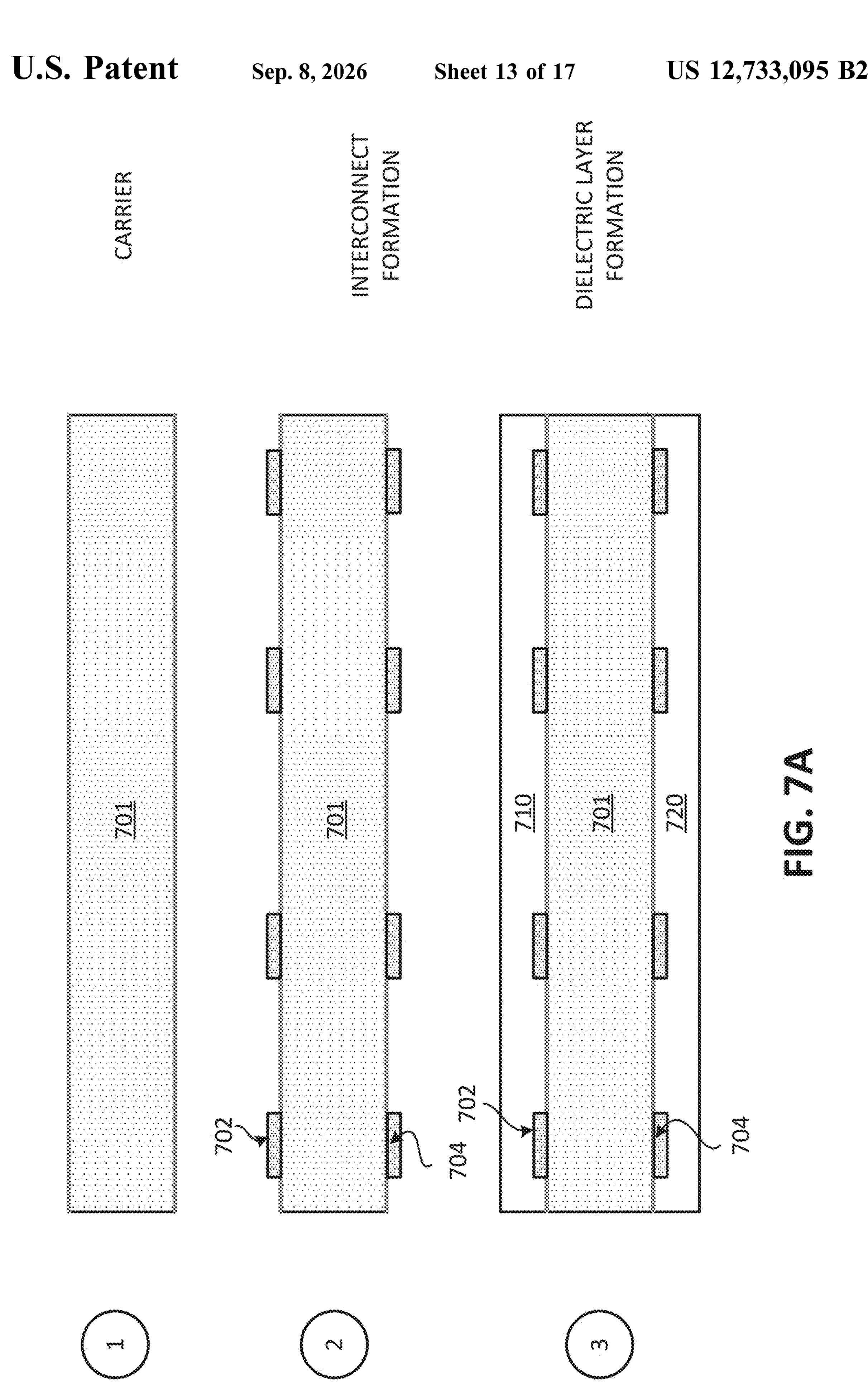
Figure 7B:
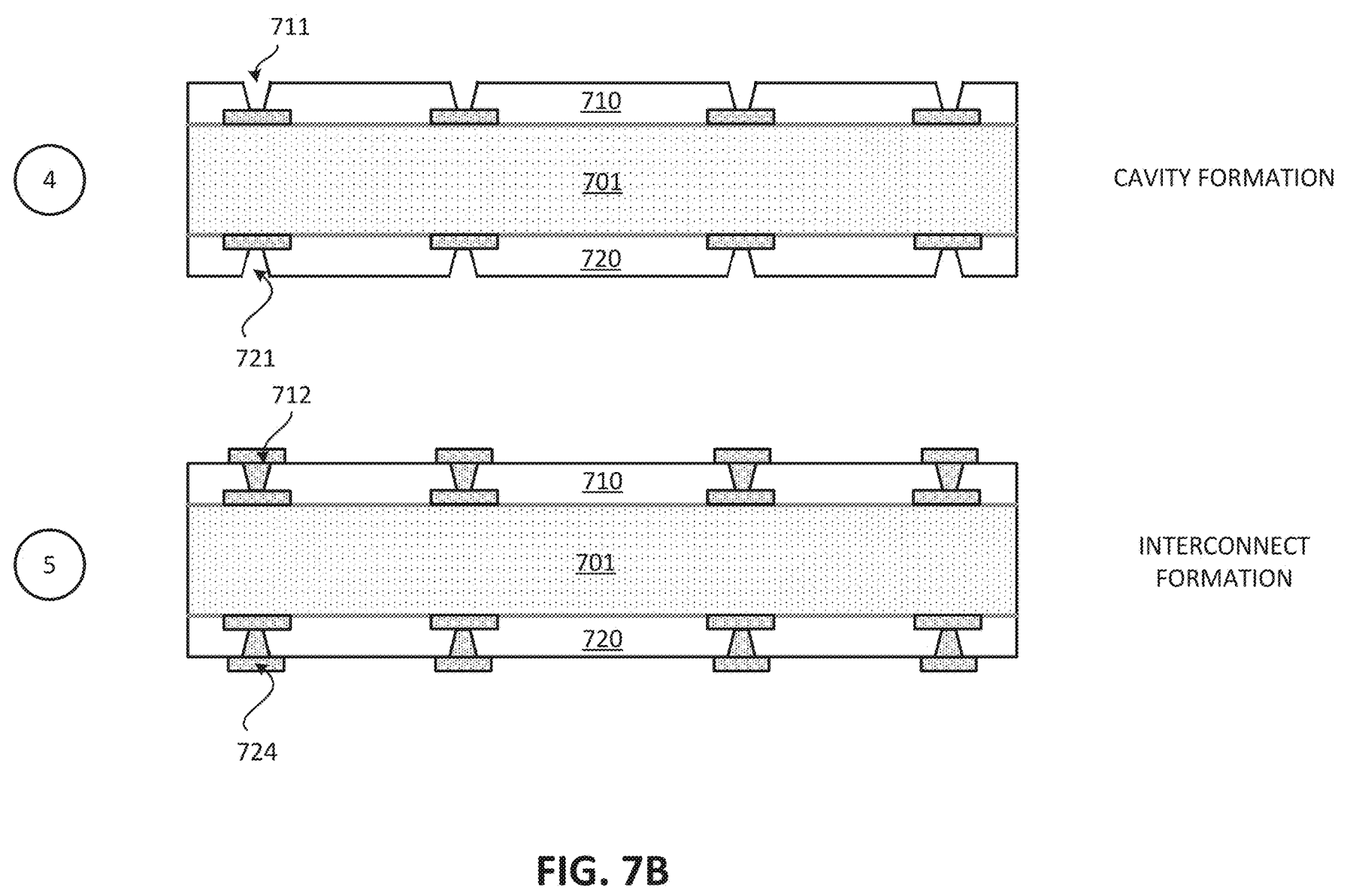
Figure 7C:
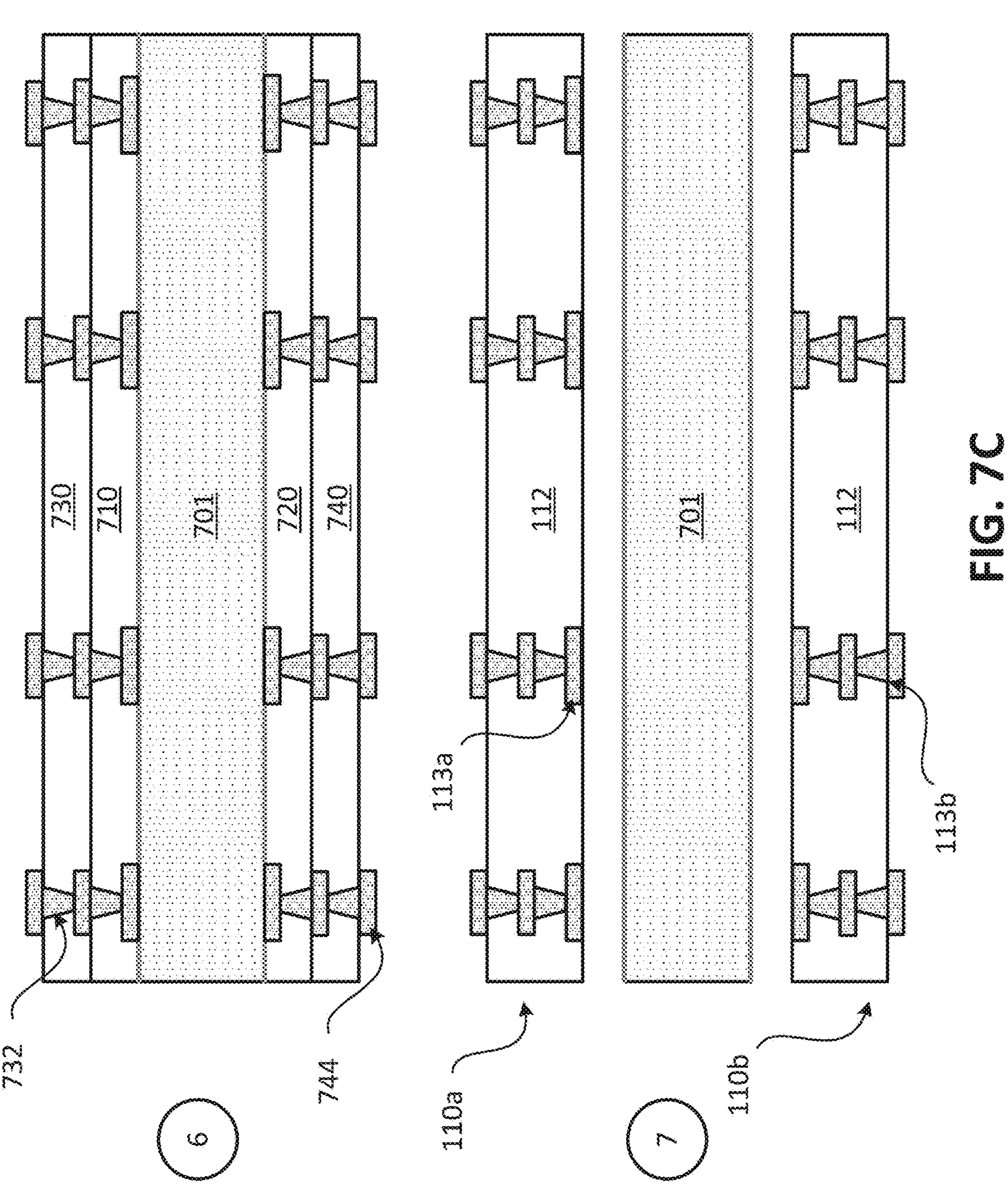

FIGS. 7A-7C illustrate an exemplary sequence for providing or fabricating an interconnect block. In some implementations, the sequence of FIGS. 7A-7C may be used to provide or fabricate any of the interconnect block described in the disclosure. In some implementations, the sequence of FIGS. 7A-7C may be used to provide or fabricate the interconnect block 110 described in the disclosure.

It should be noted that the sequence of FIGS. 7A-7C may combine one or more stages in order to simplify and/or clarify the sequence for providing or fabricating an interconnect block. In some implementations, the order of the processes may be changed or modified. In some implementations, one or more of processes may be replaced or substituted without departing from the spirit of the disclosure. Different implementations may fabricate an interconnect block differently.

Stage 1, as shown in FIG. 7A, illustrates a state after a carrier 701 is provided. The carrier 701 may include a core layer. The core layer may include seed layers on surfaces of the core layer.

Stage 2 illustrates a state after a plurality of interconnects 702 and a plurality of interconnects 704. The plurality of interconnects 702 may be coupled to a first surface (e.g., top surface) of the carrier 701. The plurality of interconnects 704 may be coupled to a second surface (e.g., bottom surface) of the carrier 701. A plating process may be used to form the plurality of interconnects 702 and the plurality of interconnects 704.

Stage 3 illustrates a state after a dielectric layer 710 and a dielectric layer 720 are provided. The dielectric layer 710 may be coupled to the first surface of the carrier 701. The dielectric layer 720 may be coupled to the second surface of the carrier 701. A deposition and/or a lamination process may be used to form the dielectric layer 710 and/or the dielectric layer 720. The dielectric layer 710 and/or the dielectric layer 720 may include prepreg, polymer and/or Ajinomoto Build-up Film (ABF).

Stage 4 of FIG. 7B, illustrates a state after a plurality of cavities 711 are formed in the dielectric layer 710, and a plurality of cavities 721 are formed in the dielectric layer 720. An exposure and development process may be used to form the plurality of cavities 711 in the dielectric layer 710 and the plurality of cavities 721 in the dielectric layer 720. Different implementations may use different processes to form the plurality of cavities.

Stage 5 illustrates a state after a plurality of interconnects 712 are formed in the dielectric layer 710, and a plurality of interconnects 724 are formed in the dielectric layer 720. The plurality of interconnects 712 may be coupled to the plurality of interconnects 702. The plurality of interconnects 714 may be coupled to the plurality of interconnects 704. A plating process may be used to form the plurality of interconnects 712 and/or the plurality of interconnects 714.

Stage 6, as shown in FIG. 7C, illustrates a state after several build up layers are formed, which may include several dielectric layers and a plurality of interconnects. For example, a dielectric layer 730 may be formed and coupled to the dielectric layer 710, and a plurality of interconnects 732 may be formed in at least in the dielectric layer 730. The plurality of interconnects 732 may be coupled to the plurality of interconnects 712. A dielectric layer 740 may be formed and coupled to the dielectric layer 720, and a plurality of interconnects 744 may be formed in at least in the dielectric layer 740. The plurality of interconnects 744 may be coupled to the plurality of interconnects 724. The process and/or sequence of fabricating the build up layers may be similar to what is shown and described in at least stage 3 of FIG. 7A through stage 5 of FIG. 7B, and may be iteratively repeated in some implementations.

Stage 7 illustrates a state after the dielectric layers and the plurality of interconnects are separated from the carrier 701 to form one or more interconnect blocks. For example, an interconnect block 110*a* may include at least one block dielectric layer 112*a* and a plurality of block interconnects 113*a*, which has been separated from the carrier 701. The at least one block dielectric layer 112*a* may represent the dielectric layer 710 and/or the dielectric layer 730. The plurality of block interconnects 113*a* may represent the plurality of interconnects 702, the plurality of interconnects 712 and/or the plurality of interconnects 732. An interconnect block 110*b* may include at least one block dielectric layer 112*b* and a plurality of block interconnects 113*b*, which has been separated from the carrier 701. The at least one block dielectric layer 112*b* may represent the dielectric layer 720 and/or the dielectric layer 740. The plurality of block interconnects 113*b* may represent the plurality of interconnects 704, the plurality of interconnects 724 and/or the plurality of interconnects 744.

Exemplary Flow Diagram of a Method for Fabricating an Interconnect Block

Figure 8:
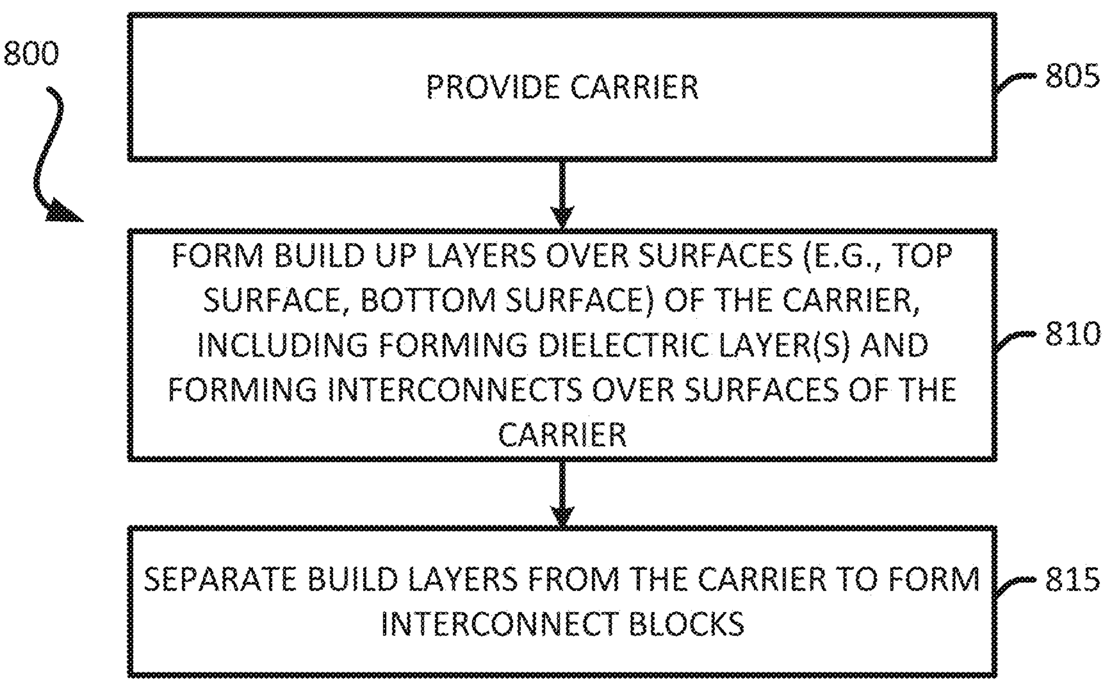
FIG. 8 illustrates an exemplary sequence for fabricating an interconnect block.

In some implementations, fabricating an interconnect block includes several processes. FIG. 8 illustrates an exemplary flow diagram of a method 800 for providing or fabricating an interconnect block. In some implementations, the method 800 of FIG. 8 may be used to provide or fabricate the interconnect block 110.

It should be noted that the method 800 of FIG. 8 may combine one or more processes in order to simplify and/or clarify the method for providing or fabricating a substrate. In some implementations, the order of the processes may be changed or modified.

The method provides (at 805) a carrier. Stage 1 of FIG. 7A, illustrates and describes an example of a state after a carrier 701 is provided. The carrier 701 may include a core layer. The core layer may include seed layers on surfaces of the core layer.

The method forms (at 810) build up layers that are coupled to the carrier. The build up layers may include at least one dielectric layer and a plurality of interconnects. Stage 2 of FIG. 7A through stage 6 of FIG. 7C, illustrates and describes an example of forming build up layers that include at least one dielectric layer and a plurality of interconnects. Stage 2 of FIG. 7A, illustrates and describes an example of a state after a plurality of interconnects 702 and a plurality of interconnects 704. The plurality of interconnects 702 may be coupled to a first surface (e.g., top surface) of the carrier 701. The plurality of interconnects 704 may be coupled to a second surface (e.g., bottom surface) of the carrier 701. A plating process may be used to form the plurality of interconnects 702 and the plurality of interconnects 704.

Stage 3 of FIG. 7A, illustrates and describes an example of a state after a dielectric layer 710 and a dielectric layer 720 are provided. The dielectric layer 710 may be coupled to the first surface of the carrier 701. The dielectric layer 720 may be coupled to the second surface of the carrier 701. A deposition and/or a lamination process may be used to form the dielectric layer 710 and/or the dielectric layer 720. The dielectric layer 710 and/or the dielectric layer 720 may include prepreg, polymer and/or Ajinomoto Build-up Film (ABF).

Stage 4 of FIG. 7B, illustrates and describes an example of a state after a plurality of cavities 711 are formed in the dielectric layer 710, and a plurality of cavities 721 are formed in the dielectric layer 720. An exposure and development process may be used to form the plurality of cavities 711 in the dielectric layer 710 and the plurality of cavities 721 in the dielectric layer 720. Different implementations may use different processes to form the plurality of cavities.

Stage 5 of FIG. 7B, illustrates and describes an example, a state after a plurality of interconnects 712 are formed in the dielectric layer 710, and a plurality of interconnects 724 are formed in the dielectric layer 720. The plurality of interconnects 712 may be coupled to the plurality of interconnects 702. The plurality of interconnects 714 may be coupled to the plurality of interconnects 704. A plating process may be used to form the plurality of interconnects 712 and/or the plurality of interconnects 714.

Stage 6 of FIG. 7C, illustrates and describes an example of a state after several build up layers are formed, which may include several dielectric layers and a plurality of interconnects. For example, a dielectric layer 730 may be formed and coupled to the dielectric layer 710, and a plurality of interconnects 732 may be formed in at least in the dielectric layer 730. The plurality of interconnects 732 may be coupled to the plurality of interconnects 712. A dielectric layer 740 may be formed and coupled to the dielectric layer 720, and a plurality of interconnects 744 may be formed in at least in the dielectric layer 740. The plurality of interconnects 744 may be coupled to the plurality of interconnects 724. The process and/or sequence of fabricating the build up layers may be similar to what is shown and described in at least stage 3 of FIG. 7A through stage 5 of FIG. 7B, and may be iteratively repeated in some implementations.

The method separates (at 815) the dielectric layers and the plurality of interconnects from the carrier. Stage 7 of FIG. 7C, illustrates and describes an example of a state after the dielectric layers and the plurality of interconnects are separated from the carrier 701 to form one or more interconnect blocks. For example, an interconnect block 110*a* may include at least one block dielectric layer 112*a* and a plurality of block interconnects 113*a*, which has been separated from the carrier 701. The at least one block dielectric layer 112*a* may represent the dielectric layer 710 and/or the dielectric layer 730. The plurality of block interconnects 113*a* may represent the plurality of interconnects 702, the plurality of interconnects 712 and/or the plurality of interconnects 732. An interconnect block 110*b* may include at least one block dielectric layer 112*b* and a plurality of block interconnects 113*b*, which has been separated from the carrier 701. The at least one block dielectric layer 112*b* may represent the dielectric layer 720 and/or the dielectric layer 740. The plurality of block interconnects 113*b* may represent the plurality of interconnects 704, the plurality of interconnects 724 and/or the plurality of interconnects 744.

Exemplary Electronic Devices

Figure 9:
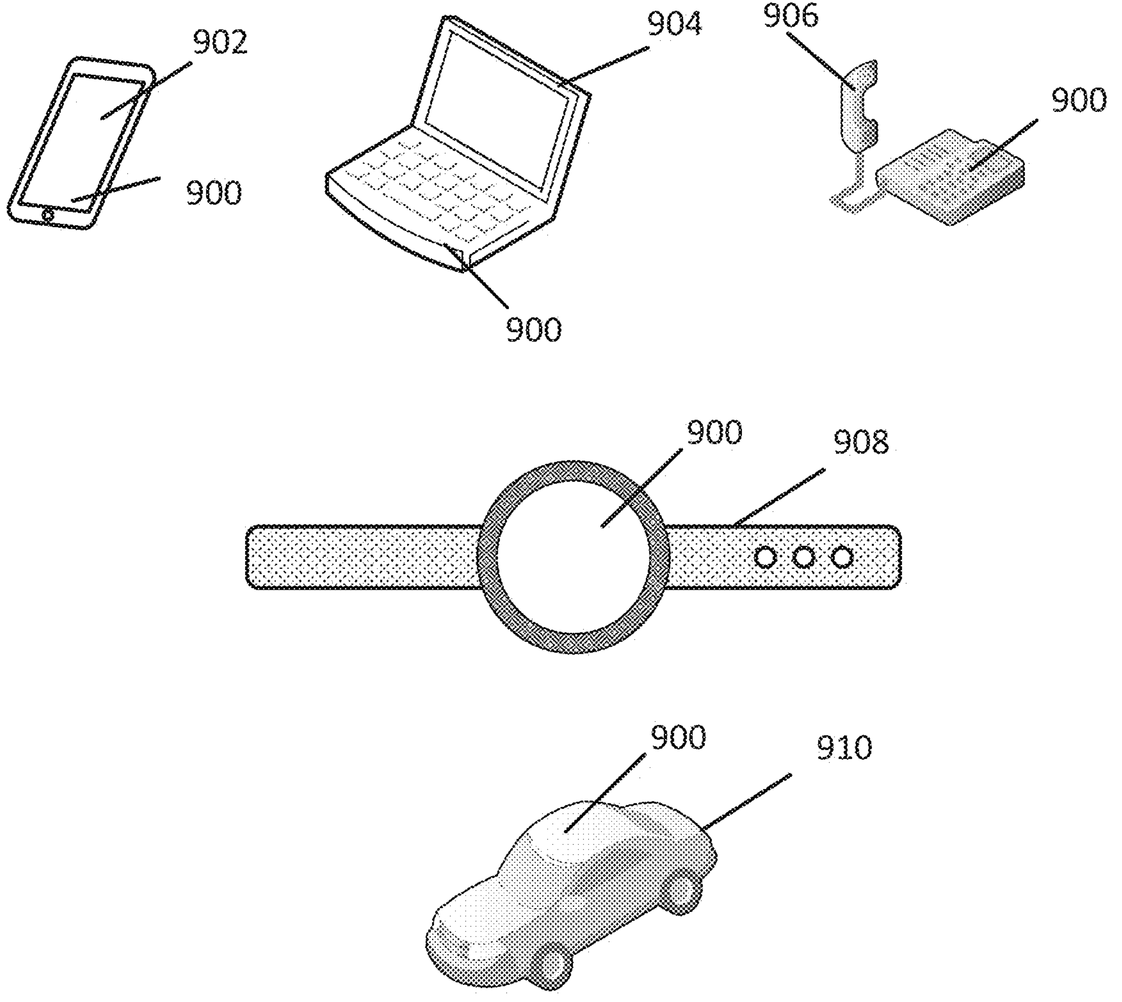
FIG. 9 illustrates various electronic devices that may integrate a die, an electronic circuit, an integrated device, an integrated passive device (IPD), a passive component, a package, and/or a device package described herein.

FIG. 9 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 902, a laptop computer device 904, a fixed location terminal device 906, a wearable device 908, or automotive vehicle 910 may include a device 900 as described herein. The device 900 may be, for example, any of the devices and/or integrated circuit (IC) packages described herein. The devices 902, 904, 906 and 908 and the vehicle 910 illustrated in FIG. 9 are merely exemplary. Other electronic devices may also feature the device 900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-4, 5A-5G, 6, 7A-7C, and/or 8-9 may be rearranged and/or combined into a single component, process, feature or function or embodied in several components, processes, or functions. Additional elements, components, processes, and/or functions may also be added without departing from the disclosure. It should also be noted FIGS. 1-4, 5A-5G, 6, 7A-7C, and/or 8-9 and its corresponding description in the present disclosure is not limited to dies and/or ICs. In some implementations, FIGS. 1-4, 5A-5G, 6, 7A-7C, and/or 8-9 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A substrate comprising a core layer; at least one first dielectric layer coupled to a first surface of the core layer; at least one second dielectric layer coupled to a second surface of the core layer; a plurality of interconnects located at least partially in the at least one first dielectric layer; a region comprising a plurality of block interconnects of an interconnect block; and a solder resist layer coupled to the at least one first dielectric layer.

Aspect 2: The substrate of aspect 1, wherein the solder resist layer includes a first portion with a first thickness and a second portion with a second thickness.

Aspect 3: The substrate of aspect 2, wherein the second portion of the solder resist layer is located vertically over at least part of the interconnect block, and wherein the second thickness of the second portion is less than the first thickness of the first portion.

Aspect 4: The substrate of aspects 1 through 3, wherein the interconnect block includes a first block interconnect on a first metal layer, and a second block interconnect on a second metal layer, and wherein the first block interconnect and/or the second block interconnect is located laterally on a same horizontal plane as a via interconnect from the plurality of interconnects.

Aspect 5: The substrate of aspects 1 through 4, wherein a first surface of the at least one first dielectric layer located over the interconnect block is located away from a surface of the core layer by a first distance, wherein a second surface of the at least one first dielectric layer that is not located over the interconnect block is located away from the surface of the core layer by a second distance, and wherein the first distance is greater than the second distance.

Aspect 6: The substrate of aspects 1 through 5, wherein the substrate is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 7: A package comprising a substrate comprising a core layer; at least one first dielectric layer coupled to a first surface of the core layer; at least one second dielectric layer coupled to a second surface of the core layer; a plurality of interconnects located at least partially in the at least one first dielectric layer; a region comprising a plurality of block interconnects of an interconnect block; and a solder resist layer coupled to the at least one first dielectric layer; a first integrated device coupled to the substrate through a first plurality of bump interconnects; and a second integrated device coupled to the substrate through a second plurality of bump interconnects.

Aspect 8: The package of aspect 7, wherein the solder resist layer includes a first portion with a first thickness and a second portion with a second thickness.

Aspect 9: The package of aspect 8, wherein the second portion of the solder resist layer is located vertically over at least part of the interconnect block, and wherein the second thickness of the second portion is less than the first thickness of the first portion.

Aspect 10: The package of aspects 7 through 9, wherein the interconnect block includes a first block interconnect on a first metal layer, and a second block interconnect on a second metal layer, and wherein the first block interconnect and/or the second block interconnect is located laterally on a same horizontal plane as a via interconnect from the plurality of interconnects.

Aspect 11: The package of aspects 7 through 10, wherein a first surface of the at least one first dielectric layer located over the interconnect block is located away from a surface of the core layer by a first distance, wherein a second surface of the at least one first dielectric layer that is not located over the interconnect block is located away from the surface of the core layer by a second distance, and wherein the first distance is greater than the second distance.

Aspect 12: The package of aspects 7 through 11, wherein the first plurality of bump interconnects includes a first plurality of pillar interconnects and/or a first plurality of solder interconnects, and wherein the second plurality of bump interconnects includes a second plurality of pillar interconnects and/or a second plurality of solder interconnects.

Aspect 13: The package of aspects 7 through 12, wherein an electrical path between the first integrated device and the second integrated device includes the interconnect block.

Aspect 14: The package of aspect 13, wherein the electrical path between the first integrated device and the second integrated device includes at least one block interconnect from the interconnect block.

Aspect 15: The package of aspects 7 through 14, wherein the interconnect block and the at least one first dielectric layer share a same dielectric layer.

Aspect 16: The package of aspects 7 through 15, wherein the package is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 17: A method for fabricating a substrate, comprising providing a core layer; forming at least one first dielectric layer that is coupled to a first surface of the core layer; forming at least one second dielectric layer that is coupled to a second surface of the core layer; forming a plurality of interconnects located at least partially in the at least one first dielectric layer; coupling an interconnect block comprising a plurality of block interconnects, to the at least one first dielectric layer; forming an additional first dielectric layer around and over the interconnect block; and forming a solder resist layer that is coupled to the at least one first dielectric layer.

Aspect 18: The method of aspect 17, wherein the solder resist layer includes a first portion with a first thickness and a second portion with a second thickness.

Aspect 19: The method of aspect 18, wherein the second portion of the solder resist layer is located vertically over at least part of the interconnect block, and wherein the second thickness of the second portion is less than the first thickness of the first portion.

Aspect 20: The method of aspects 17 through 19, wherein the interconnect block includes a first block interconnect on a first metal layer, and a second block interconnect on a second metal layer, and wherein the first block interconnect and/or the second block interconnect is located laterally on a same horizontal plane as a via interconnect from the plurality of interconnects.

Aspect 21: The method of aspects 17 through 20, wherein a first surface of the at least one first dielectric layer located over the interconnect block is located away from a surface of the core layer by a first distance, wherein a second surface of the at least one first dielectric layer that is not located over the interconnect block is located away from the surface of the core layer by a second distance, and wherein the first distance is greater than the second distance.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:

a core layer;

at least one first dielectric layer coupled to a first surface of the core layer;

at least one second dielectric layer coupled to a second surface of the core layer;

a plurality of interconnects located at least partially in the at least one first dielectric layer;

a region comprising a plurality of block interconnects and one or more block dielectric layers, wherein:

the plurality of block interconnects and the one or more block dielectric layers define an interconnect block, the one or more block dielectric layers touch the at least one first dielectric layer, the plurality of block interconnects are located at least partially in the one or more block dielectric layers, and some of the block interconnects from the plurality of block interconnects touch the at least one first dielectric layer;

a solder resist layer coupled to the at least one first dielectric layer; and wherein a first surface of the at least one first dielectric layer located over the interconnect block is located away from a surface of the core layer by a first distance, wherein a second surface of the at least one first dielectric layer that is not located over the interconnect block is located away from the surface of the core layer by a second distance, and wherein the first distance is greater than the second distance.

2. The substrate of claim 1, wherein the solder resist layer includes a first portion with a first thickness and a second portion with a second thickness.

3. The substrate of claim 2, wherein the second portion of the solder resist layer is located vertically over at least part of the interconnect block, and wherein the second thickness of the second portion is less than the first thickness of the first portion.

4. The substrate of claim 1, wherein the interconnect block includes a first block interconnect on a first metal layer, and a second block interconnect on a second metal layer, and wherein the first block interconnect and/or the second block interconnect is located laterally on a same horizontal plane as a via interconnect from the plurality of interconnects.

5. The substrate of claim 1, wherein the substrate is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

6. A package comprising:

a substrate comprising:

a core layer;

at least one first dielectric layer coupled to a first surface of the core layer;

at least one second dielectric layer coupled to a second surface of the core layer;

a plurality of interconnects located at least partially in the at least one first dielectric layer;

a region comprising a plurality of block interconnects and one or more block dielectric layers, wherein:

the plurality of block interconnects and the one or more block dielectric layers define an interconnect block, the one or more block dielectric layers touch the at least one first dielectric layer, the plurality of block interconnects are located at least partially in the one or more block dielectric layers, and some of the block interconnects from the plurality of block interconnects touch the at least one first dielectric layer; and a solder resist layer coupled to the at least one first dielectric layer;

a first integrated device coupled to the substrate through a first plurality of bump interconnects;

a second integrated device coupled to the substrate through a second plurality of bump interconnects; and wherein a first surface of the at least one first dielectric layer located over the interconnect block is located away from a surface of the core layer by a first distance;

wherein a second surface of the at least one first dielectric layer that is not located over the interconnect block is located away from the surface of the core layer by a second distance, and wherein the first distance is greater than the second distance.

7. The package of claim 6, wherein the solder resist layer includes a first portion with a first thickness and a second portion with a second thickness.

8. The package of claim 7, wherein the second portion of the solder resist layer is located vertically over at least part of the interconnect block, and wherein the second thickness of the second portion is less than the first thickness of the first portion.

9. The package of claim 6, wherein the interconnect block includes a first block interconnect on a first metal layer, and a second block interconnect on a second metal layer, and wherein the first block interconnect and/or the second block interconnect is located laterally on a same horizontal plane as a via interconnect from the plurality of interconnects.

10. The package of claim 6, wherein the first plurality of bump interconnects includes a first plurality of pillar interconnects and/or a first plurality of solder interconnects, and wherein the second plurality of bump interconnects includes a second plurality of pillar interconnects and/or a second plurality of solder interconnects.

11. The package of claim 6, wherein an electrical path between the first integrated device and the second integrated device includes the interconnect block.

12. The package of claim 11, wherein the electrical path between the first integrated device and the second integrated device includes (i) at least one interconnect from the plurality of interconnects of the substrate, (ii) at least one block interconnect from the interconnect block and (iii) at least one other interconnect from the plurality of interconnects of the substrate.

13. The package of claim 6, wherein the one or more block dielectric layers of the interconnect block and the at least one first dielectric layer share a same dielectric layer.

14. The package of claim 6, wherein the package is implemented in a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

15. A method for fabricating a substrate, comprising:

providing a core layer;

forming at least one first dielectric layer that is coupled to a first surface of the core layer;

forming at least one second dielectric layer that is coupled to a second surface of the core layer;

forming a plurality of interconnects located at least partially in the at least one first dielectric layer;

forming an interconnect block comprising:

one or more block dielectric layers that touch the at least one first dielectric layer, and a plurality of block interconnects over the at least one first dielectric layer, wherein the plurality of block interconnects are located at least partially in the one or more block dielectric layers, and wherein some of the block interconnects from the plurality of block interconnects touch the at least one first dielectric layer;

forming an additional first dielectric layer around and over the interconnect block;

forming a solder resist layer that is coupled to the at least one first dielectric layer; and wherein a first surface of the at least one first dielectric layer located over the interconnect block is located away from a surface of the core layer by a first distance, wherein a second surface of the at least one first dielectric layer that is not located over the interconnect block is located away from the surface of the core layer by a second distance, and wherein the first distance is greater than the second distance.

16. The method of claim 15, wherein the solder resist layer includes a first portion with a first thickness and a second portion with a second thickness.

17. The method of claim 16, wherein the second portion of the solder resist layer is located vertically over at least part of the interconnect block, and wherein the second thickness of the second portion is less than the first thickness of the first portion.

18. The method of claim 15, wherein the interconnect block includes a first block interconnect on a first metal layer, and a second block interconnect on a second metal layer, and wherein the first block interconnect and/or the second block interconnect is located laterally on a same horizontal plane as a via interconnect from the plurality of interconnects.

* * * * *